(12) United States Patent
Emrich et al.

(10) Patent No.: US 7,299,570 B2
(45) Date of Patent: Nov. 27, 2007

(54) WEAR ASSEMBLY FOR AN EXCAVATOR

(75) Inventors: Robert K. Emrich, Tigard, OR (US); Terry L. Briscoe, Portland, OR (US)

(73) Assignee: Esco Corporation, Portland, OR (US)

( * ) Notice: Subject to any disclaimer, the term of this patent is extended or adjusted under 35 U.S.C. 154(b) by 50 days.

(21) Appl. No.: 11/226,095

(22) Filed: Sep. 14, 2005

(65) Prior Publication Data

US 2006/0010726 A1 Jan. 19, 2006

Related U.S. Application Data

(63) Continuation-in-part of application No. 10/425,606, filed on Apr. 30, 2003, now Pat. No. 6,986,216.

(51) Int. Cl.
*E02F 9/28* (2006.01)

(52) U.S. Cl. .............. 37/455; 37/451; 37/456

(58) Field of Classification Search ............ 37/451, 37/450, 454, 455, 456
See application file for complete search history.

(56) References Cited

U.S. PATENT DOCUMENTS

| | | | |
|---|---|---|---|
| 1,021,185 A | 3/1912 | Foster | |
| 1,031,138 A | 7/1912 | McKee et al. | |
| 1,076,548 A | 10/1913 | Butler | |
| 1,917,431 A | 7/1933 | Clark | |
| 1,959,847 A | 5/1934 | Buskirk | |
| 2,020,215 A | 11/1935 | Ross | |
| 2,547,789 A | 4/1951 | Skeel | |
| 3,032,152 A | 5/1962 | Titsler | |
| 3,121,289 A | 2/1964 | Eyolfson | |
| 3,160,987 A | 12/1964 | Nichols | |
| 3,413,740 A | 12/1968 | Peterson | |
| 3,621,594 A | 11/1971 | Hahn et al. | |
| 3,685,177 A | 8/1972 | Hahn et al. | |
| 3,722,932 A | 3/1973 | Dougall | |
| 3,736,684 A | 6/1973 | Black et al. | |
| 3,841,007 A | 10/1974 | Howarth et al. | |
| 3,864,853 A | 2/1975 | Klett et al. | |

(Continued)

FOREIGN PATENT DOCUMENTS

WO PCT WO 02/12642 2/2002

OTHER PUBLICATIONS

ESCO Brochure, "Instructions for T4-V71, T4L-v71 & T4R-V&1 Topick® Adapters", M/LMS-504-0302, 2002, pp.

(Continued)

*Primary Examiner*—Thomas A Beach
(74) *Attorney, Agent, or Firm*—Steven P. Schad

(57) ABSTRACT

A wear assembly for attaching a wear member to a support structure that includes a wear member and a lock. The wear member includes a pair of legs to straddle the support structure, each with a hole that aligns with a hole in the support structure for receiving a lock to hold the wear member in place. Each hole includes a recess with an engagement surface facing generally away from the support structure for receiving portions of the lock. The lock includes a wedge provided with a thread formation that threadedly engages a second thread formation in the aligned holes so that rotation of the wedge axially drives the wedge.

10 Claims, 22 Drawing Sheets

U.S. PATENT DOCUMENTS

| | | |
|---|---|---|
| 3,947,982 A | 4/1976 | Mantovani |
| 3,995,384 A | 12/1976 | Wood |
| 4,006,544 A | 2/1977 | Stepe |
| D245,780 S | 9/1977 | Dahlberg et al. |
| 4,103,442 A | 8/1978 | Zepf |
| 4,167,355 A | 9/1979 | Hansson |
| 4,282,665 A | 8/1981 | Fletcher et al. |
| 4,326,348 A | 4/1982 | Emrich |
| 4,372,703 A | 2/1983 | Szostak |
| 4,380,102 A | 4/1983 | Hansson |
| 4,433,496 A | 2/1984 | Jones et al. |
| 4,449,309 A | 5/1984 | Hemphill |
| 4,457,380 A | 7/1984 | Curry |
| 4,501,079 A | 2/1985 | Hahn et al. |
| 4,540,309 A | 9/1985 | Hansson |
| 4,570,365 A | 2/1986 | Bierwith |
| 4,626,034 A * | 12/1986 | Breuer et al. ............... 299/108 |
| 4,716,667 A * | 1/1988 | Martin ....................... 37/453 |
| 4,748,754 A | 6/1988 | Schwappach |
| 4,762,372 A * | 8/1988 | Rassmann et al. ......... 299/108 |
| 5,005,304 A | 4/1991 | Briscoe et al. |
| 5,016,365 A | 5/1991 | Robinson |
| 5,052,134 A | 10/1991 | Bierwith |
| 5,063,695 A | 11/1991 | Briscoe et al. |
| 5,068,986 A | 12/1991 | Jones |
| 5,074,062 A | 12/1991 | Hahn et al. |
| 5,075,986 A | 12/1991 | Smith et al. |
| 5,088,214 A | 2/1992 | Jones |
| 5,233,770 A | 8/1993 | Robinson |
| 5,241,765 A | 9/1993 | Jones et al. |
| 5,311,681 A | 5/1994 | Ruvang et al. |
| 5,331,754 A | 7/1994 | Ruvang |
| 5,361,520 A | 11/1994 | Robinson |
| 5,396,964 A | 3/1995 | Shelhorn et al. |
| 5,410,826 A | 5/1995 | Immel et al. |
| 5,412,885 A * | 5/1995 | Cornelius ................... 37/451 |
| 5,438,774 A | 8/1995 | Fletcher et al. |
| 5,452,529 A | 9/1995 | Neuenfeldt et al. |
| 5,465,512 A | 11/1995 | Livesay et al. |
| 5,469,648 A | 11/1995 | Jones et al. |
| 5,491,915 A | 2/1996 | Robinson |
| 5,553,409 A | 9/1996 | Irving |
| 5,564,206 A | 10/1996 | Ruvang |
| 5,564,508 A | 10/1996 | Renski |
| 5,634,285 A | 6/1997 | Cornelius |
| 5,638,621 A | 6/1997 | Chesterfield et al. |
| 5,653,048 A | 8/1997 | Livesay et al. |
| 5,713,145 A | 2/1998 | Bender et al. |
| 5,718,070 A | 2/1998 | Emrich |
| 5,784,813 A | 7/1998 | Balassa et al. |
| 5,806,218 A | 9/1998 | Brinkley |
| 5,833,323 A | 11/1998 | Massa et al. |
| 5,852,888 A | 12/1998 | Mack |
| 5,868,518 A | 2/1999 | Hedley |
| 5,909,962 A | 6/1999 | Ruvang et al. |
| 5,937,549 A | 8/1999 | Bender et al. |
| 5,937,550 A | 8/1999 | Emrich |
| 5,964,547 A | 10/1999 | Brinkley |
| 5,992,063 A | 11/1999 | Mack |
| 6,009,644 A | 1/2000 | Hedley |
| 6,108,950 A | 8/2000 | Ruvang et al. |
| 6,145,224 A | 11/2000 | Stickling |
| 6,151,812 A | 11/2000 | Bierwith |
| 6,194,080 B1 | 2/2001 | Stickling |
| 6,209,238 B1 | 4/2001 | Ruvang |
| 6,301,810 B1 | 10/2001 | Fidler |
| 6,986,216 B2 * | 1/2006 | Emrich et al. ............... 37/450 |
| 7,036,249 B2 * | 5/2006 | Mautino ..................... 37/457 |

OTHER PUBLICATIONS

ESCO Booklet; "ESCO Toplok Adapter System For Plate Lips", Mining College '97, DMC Sep. 9, 1997, Illustrations 1-23.

Clark Equipment, Bucket Tooth Adapter Installation Drawing, No. 1546546, Mar. 13, 1970.

Illustration of V61 Hot Slag Pin Sold by ESCO Before Jul. 2, 2002.

* cited by examiner

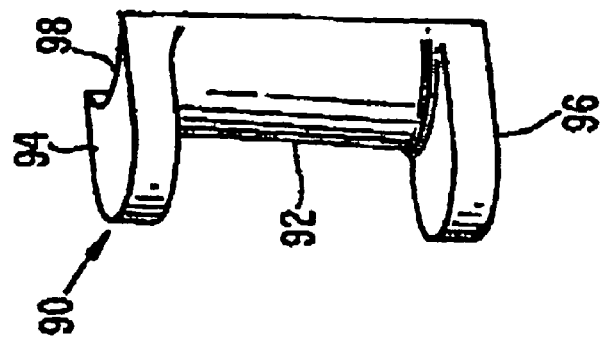
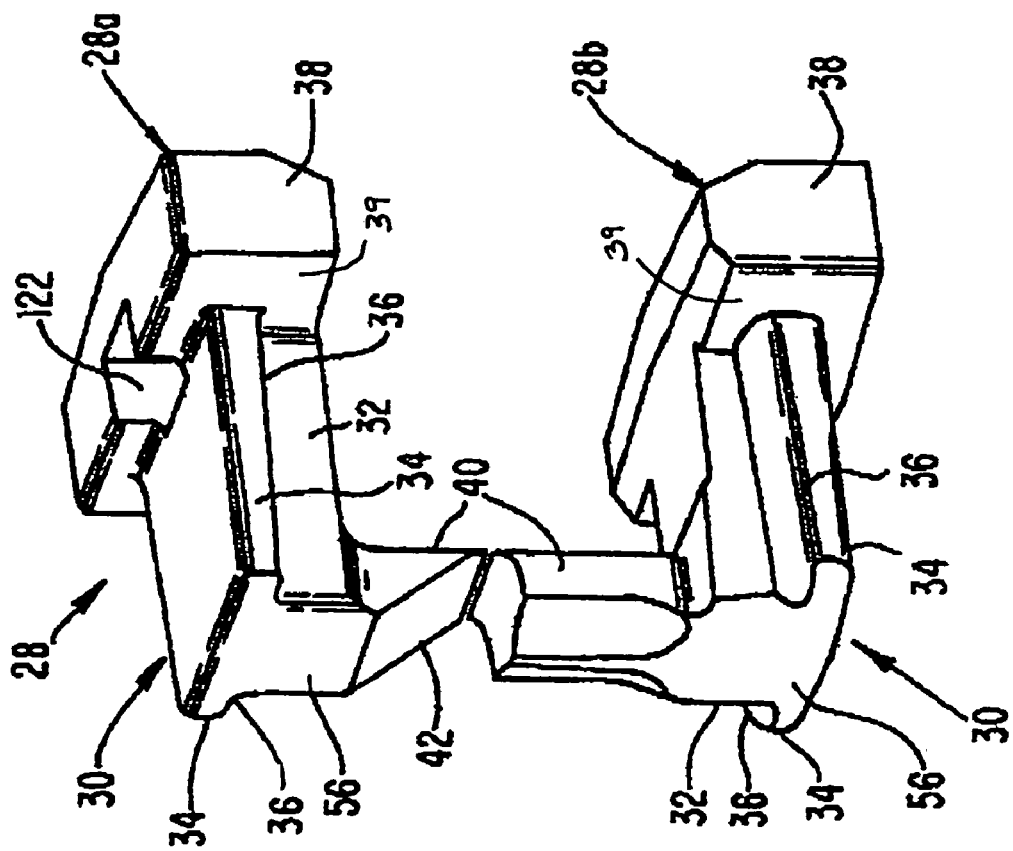

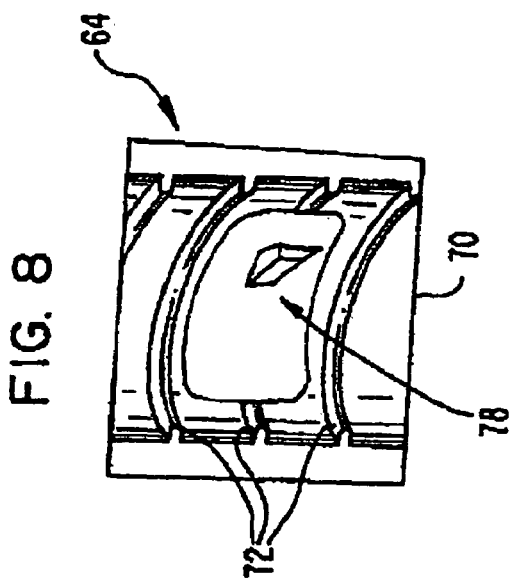
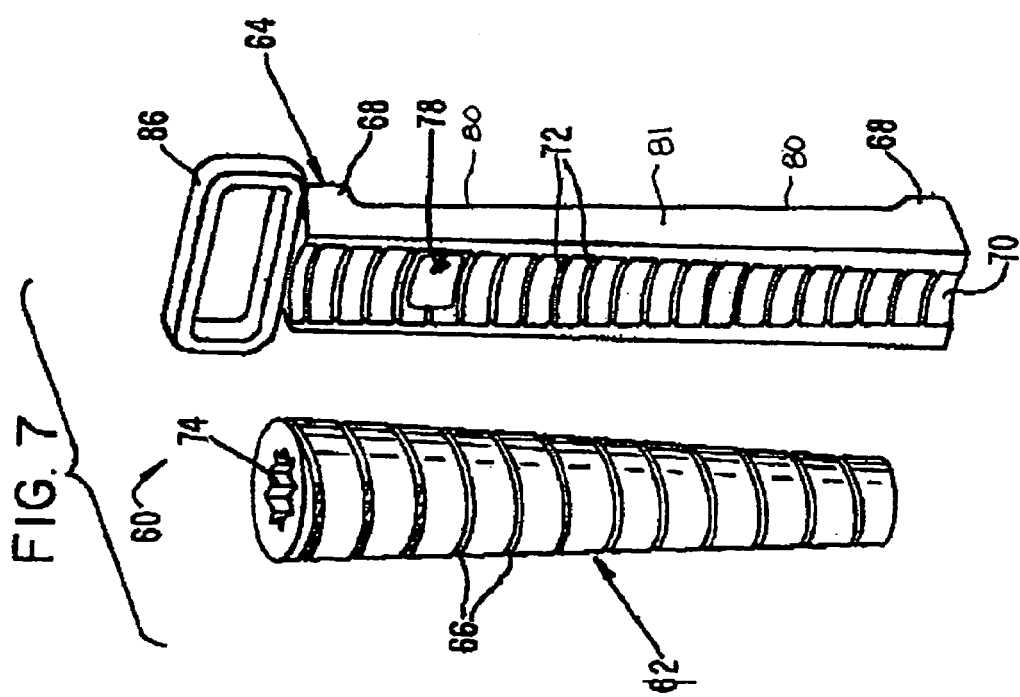

FIG. 18
FIG. 19
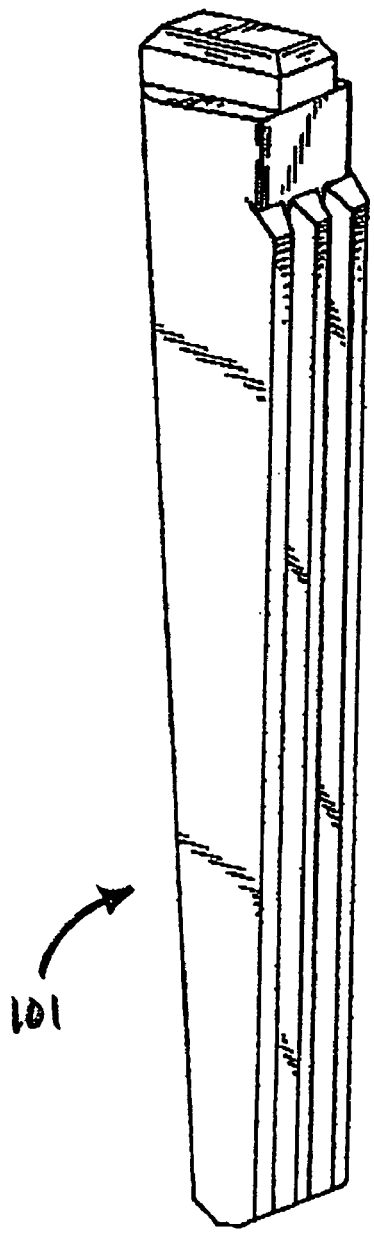
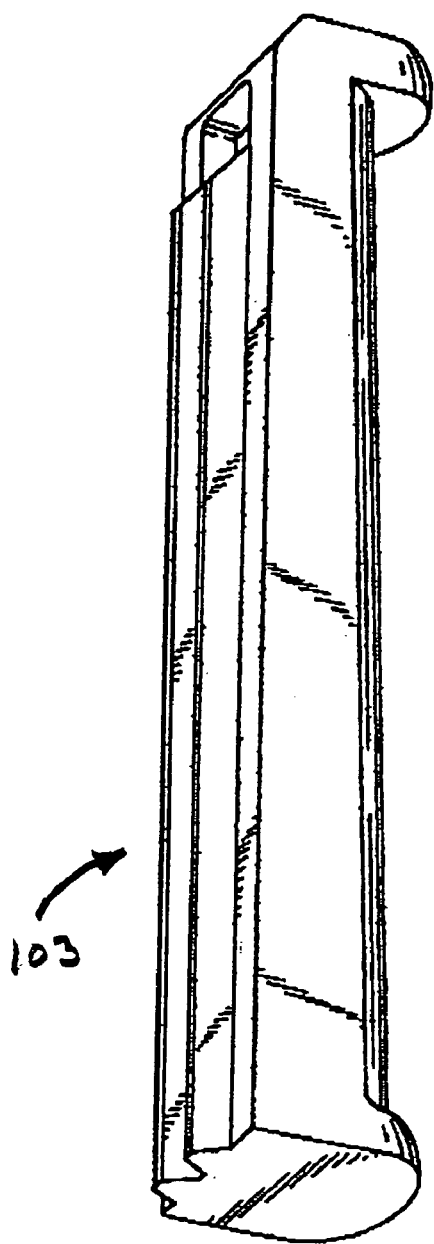

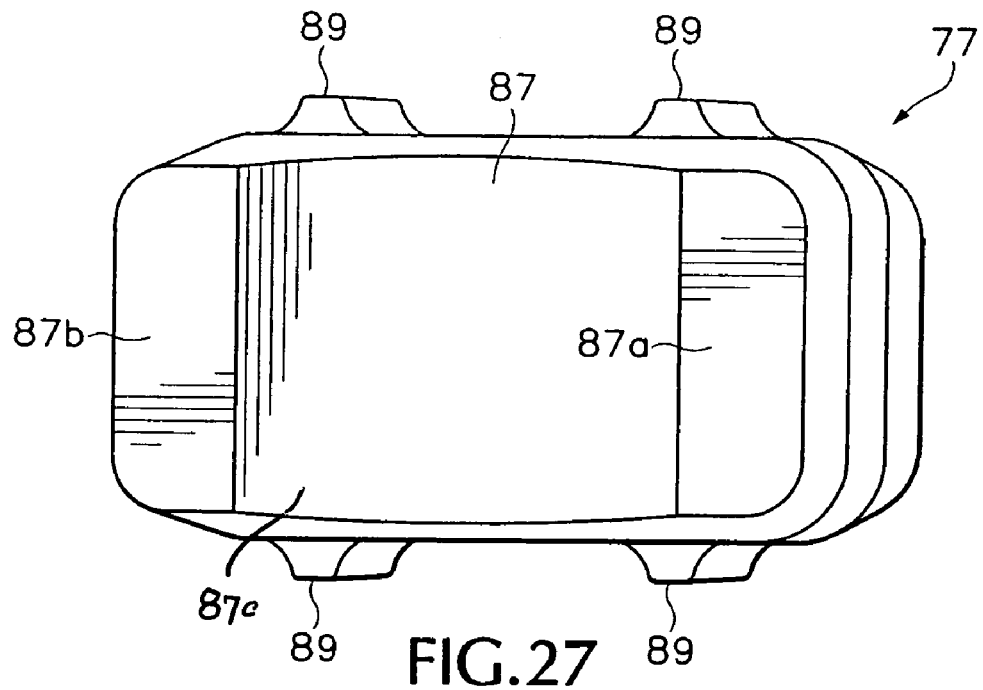
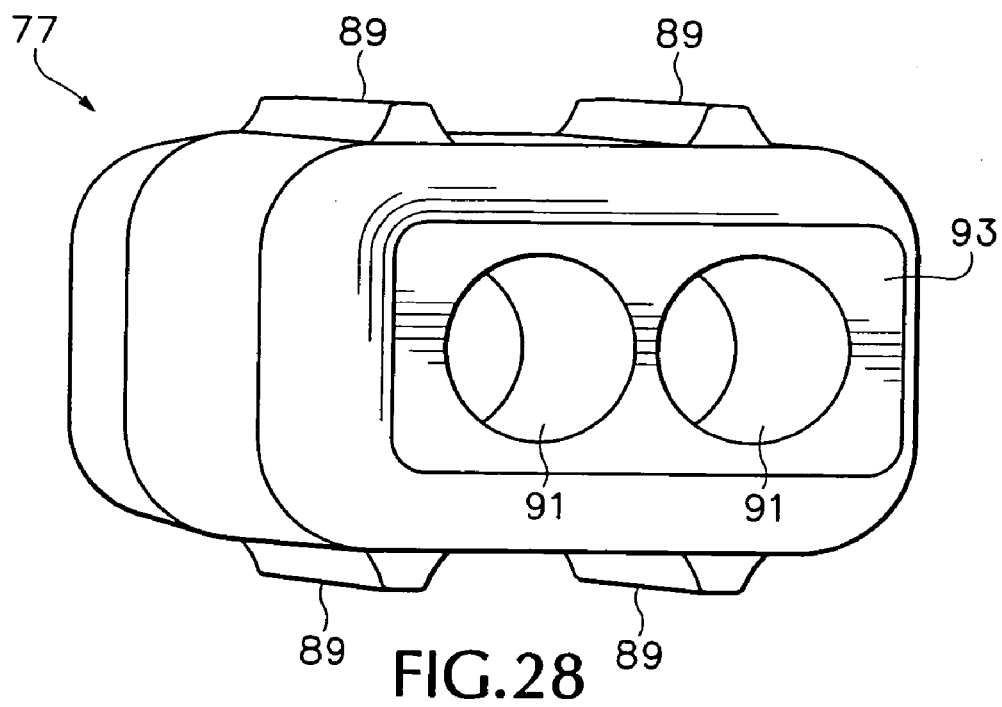

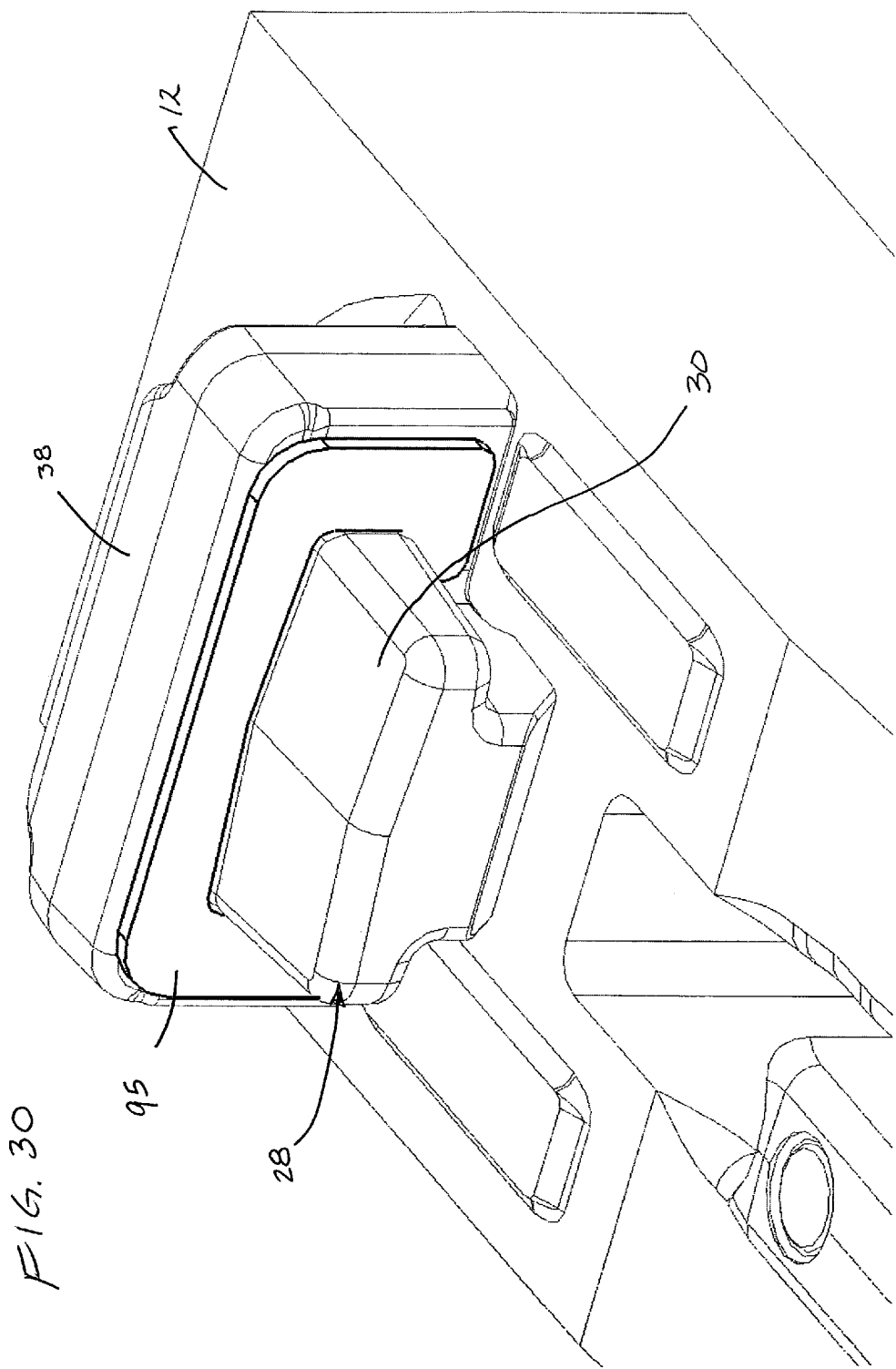

WEAR ASSEMBLY FOR AN EXCAVATOR

This application is a continuation-in-part application of application Ser. No. 10/425,606, filed Apr. 30, 2003, now U.S. Pat. No. 6,986,216.

FIELD OF THE INVENTION

The present invention pertains to a wear assembly and particularly for the attachment of a wear member to the digging edge of a bucket or other excavator.

BACKGROUND OF THE INVENTION

It is a common practice to secure wear members in the form of teeth and shrouds along the digging edge of a bucket or other excavator to protect the front lip from premature wear. The teeth project forward of the lip to ease penetration and break up the ground to be gathered in the bucket. The shrouds are mounted to the lip between the teeth. As can be appreciated, the wear members, and particularly the teeth, are often placed in harsh working conditions where they are subjected to very heavy loading and a high degree of wearing.

Excavating teeth are generally composed of a multiple of parts including, for example, an adapter, a point and a lock. The adapter has a rear mounting end configured for attachment to the front lip of the bucket, and a forwardly projecting nose for mounting the point. The point is a tapered member provided with a forward earth-penetrating end and rearwardly opening socket that receives the adapter nose. The lock is fit within the wear assembly to hold the point to the adapter. Although the points wear out most frequently, the adapters are also subjected to wear and require periodic replacement.

Adapters are often welded to the bucket lip, such as in U.S. Pat. No. 4,577,423 to Hahn. Although welding securely attaches the adapter to the bucket to withstand the heavy loads, the replacement of weld-on adapters is difficult and typically performed at a shop rather than in the field. This causes the bucket to be placed out of commission, which, particularly in the case of the larger buckets, can result in a serious economic loss for the operator of a mine or other excavating site. Accordingly, the time and difficulty required to remove and install such weld-on adapters has proven to be a significant deterrent.

To enable replacement in the field, adapters have been developed that are mechanically attached to the bucket lip. The most common is known as a Whisler-style adapter (e.g., as shown in U.S. Pat. No. 4,267,653 to Hahn). In these arrangements, the rear mounting end of the adapter comprises a pair of bifurcated legs which straddle the bucket lip. Each leg of the adapter includes an opening that is aligned with a through-hole or keyway formed in the lip of the bucket. The rear ends of the legs are formed with ramp surfaces that are inclined upward and away from the respective openings. A spool and wedge are inserted into the aligned openings and through-hole to secure the adapter in place.

More specifically, the spool is generally C-shaped with arms that are configured to matingly engage the ramp surfaces of the legs. Insertion of the wedge between the spool and the front of the through-hole presses the spool rearward with the arms riding over the ramp surfaces of the legs. In this way, the arms pinch the legs against the inner and outer surfaces of the lip to secure the adapter in place. The wedge is usually inserted into the assembly by repeated blows with a large hammer. This can be an onerous and time-consuming task for field workers, especially to achieve the final movement needed to adequately hold the adapter to the lip. Further, the wedge even when tightly inserted can become loose under heavy loading, thus, risking loss of the adapter. A significant contributor to the loosening is actual stretching of the C-shaped spool under service loading, such as when the legs of the adapter shift on the lip under heavy loading. At times, the wedge is welded to the spool in its tightened position in an effort to resist such loosening. This action, however, prevents re-tightening of the lock, which allows assembly looseness, resulting in higher stresses in the wear member and a faster rate of wear on the lip. The welding together of the wedge and spool also causes removal of the lock to be more difficult.

U.S. Pat. No. 5,653,048 to Jones et al. discloses another mechanically attached adapter. In lieu of a through-hole, a boss is welded along the face of the lip. The boss is generally T-shaped and is received in a complementary slot formed in the leg of the adapter. An opening is provided at the rear end of the leg for receiving a lock. The lock, then, abuts the rear end of the boss and the rear wall of the opening to prevent the adapter from sliding forward off the boss and the lip. While this provides good support for most teeth, there is a desire for improvement for use in excavator types that deliver equally large vertical orientation loads from both the top and the bottom directions.

SUMMARY OF THE INVENTION

In the present invention, a wear member is securely attached to the lip of a bucket or other excavator by a mechanical means that facilitates easy installation and removal.

In accordance with one aspect of the present invention, the lip is provided with a through-hole and a boss to secure a wear member in place. The boss and wear member include a tongue and groove arrangement to support the wear member in resisting the applied loads. The through-hole is adapted to receive a lock to prevent removal of the wear member from the lip.

In the preferred construction, the boss is positioned at the rear end of the wear member to provide enhanced resistance to lateral and/or vertical loading. In addition, the lip is formed with a rear member to engage the rear of the wear member and provide additional resistance to axial forces. Such added support functions to protect the lip and provide it with a longer useful life with less maintenance. Preferably, the rear member is formed as part of the boss, to complement the support provided by the boss and better stabilize the mounting of the wear member on the lip. Moreover, irrespective of whether the rear member functions as an abutment, the rear member is preferably provided and fixed to the rails for enhanced support.

The wear member preferably has a pair of rearwardly extending bifurcated legs that each includes an inner surface to face the lip, a rear wall, a slot that opens in the inner face and the rear wall to receive a boss to resist loads applied during use, an opening forward of the slot for receiving a lock to retain the wear member on the lip, and a lateral wall extending between the slot and the opening.

In one construction, the bosses are formed to be generally L-shaped with a stem that fits into the rear end of the through-hole in the lip, and a main body that lies along a face of the lip to cooperate with the wear member. Bosses are preferably provided along the inner face and the outer face of the lip to hold the inner and outer legs of the wear members. The interconnection of the legs and bosses resists shifting of the legs which in the past has led to the stressing, bending and loosening of the locks. In this embodiment, the bosses are welded to the lip and to each other in the through-holes. In this way, a lip formed to accommodate a Whisler-style adapter can be easily modified to make use of the present invention.

In one preferred embodiment, a threaded wedge and spool assembly is used to secure the wear member in place on the lip. Specifically, a conically shaped wedge includes a thread structure that engages a cooperating thread structure on the spool so that the wedge is driven into and out of the through-hole via rotation of the wedge. The use of a threaded wedge and spool eases installation and removal of the lock, and reduces the risk of lock loss during use of the excavator. Moreover, the threaded wedge can be easily retightened to keep the wear member snugly mounted on the lip.

In another aspect of the invention, an insert is provided at the front end of the through-hole to provide increased bearing support for the wedge through a longer bearing length and a higher hardness, less deformable material than is possible in the lip itself.

The present invention significantly increases the strength and stability of the wear member on the lip, leading to longer service life of the wear member and a reduced maintenance requirement on the lip. With use of the preferred locking device, it also increases ease and safety in fixing wear members to a lip of a bucket or other excavator. No large hammers are required to install or remove the lock. The need to work under the lip to remove the lock is eliminated. The locks can be removed and installed quickly and easily to greatly ease the replacement of the wear members in the field or elsewhere.

The placement of the boss at the rear of the wear member offers maximum possible resistance to vertical and lateral loads applied to the teeth during use. The abutments further stabilize the teeth and reduce stress on the front of the lip by resisting axial loads. The bosses can be attached to new lips or to existing lips that were originally constructed to mount traditional Whisler-style adapters. This additional stability along with the retightening advantage of the lock reduces the frequency of lip maintenance and provides longer adapter service.

BRIEF DESCRIPTION OF THE DRAWINGS

FIG. 4 is a perspective view of the two bosses to be attached to the lip.

FIG. 5 is a perspective view of a keyway insert in accordance with the present invention.

FIG. 7 is an exploded view of a lock in accordance with the present invention.

FIG. 8 is an enlarged front view of a portion of the spool showing a ratchet pawl.

FIG. 18 is a perspective view of a wedge of an alternative lock.

FIG. 19 is a perspective view of a spool to cooperate with the wedge of FIG. 18 in forming the alternative lock.

FIG. 27 is a front perspective view of the retainer of the alternative embodiment.

FIG. 28 is a rear perspective view of the retainer of the alternative embodiment.

FIG. 30 is a partial perspective view of a boss on a lip with the alternative insert.

DETAILED DESCRIPTION OF PREFERRED EMBODIMENTS

Figure 1:
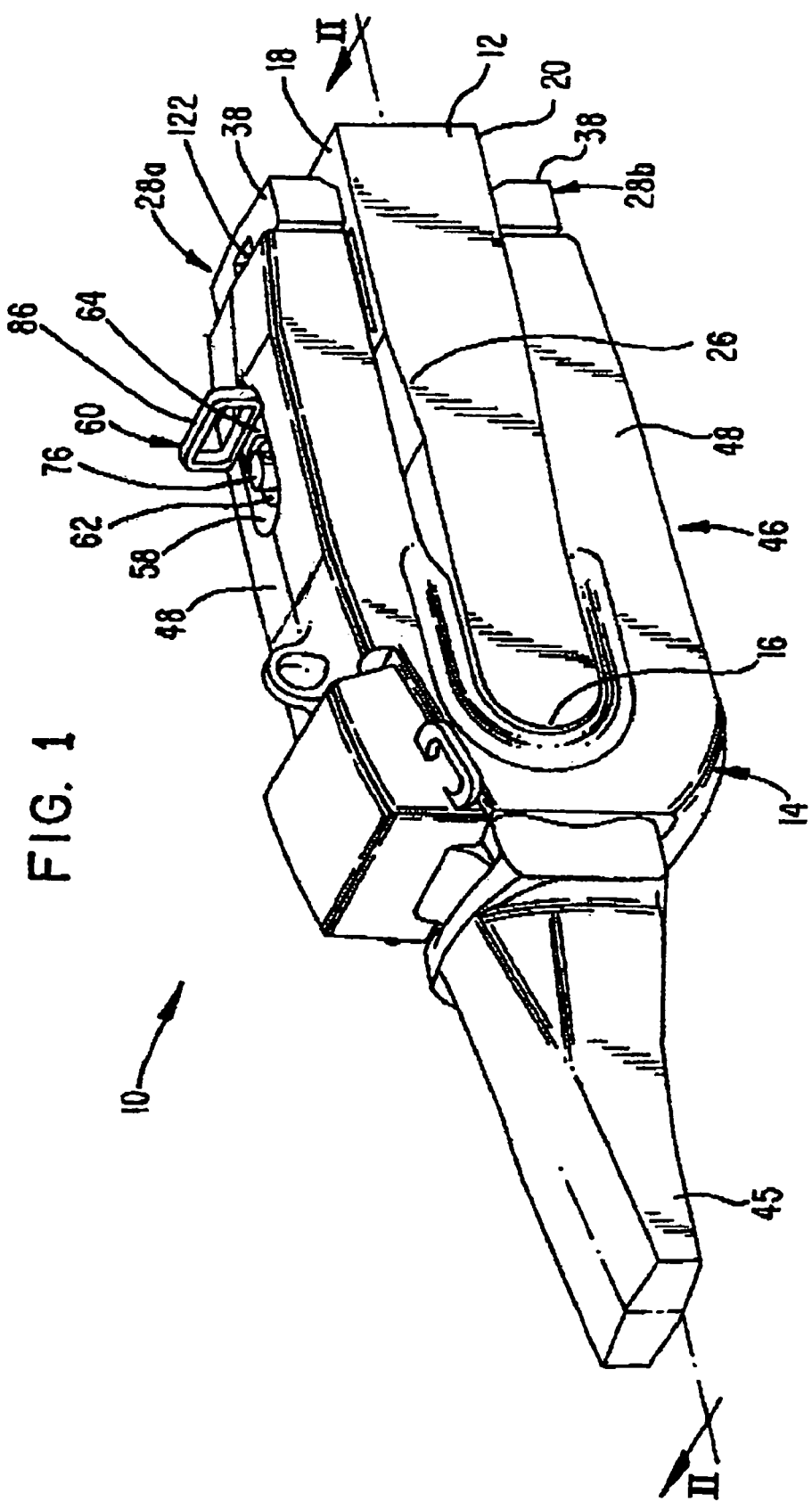
FIG. 1 is a perspective view of a wear assembly in accordance with the present invention.

The present invention relates to a wear assembly 10 for mounting a wear member onto a support structure such as a bucket or other excavator (FIG. 1). The present invention is particularly suited for mounting an adapter 14 for an excavating tooth to a lip, but could also be used to secure other wear members, such as shrouds. For ease of discussion, the invention will be described in terms of mounting an adapter to a lip of a bucket.

In one example, lip 12 defines a digging edge 16 of a bucket, and includes an inner face 18 and an outer face 20 (FIGS. 1-3 and 9). A front tab 22 preferably projects forward from the digging edge to aid in placing and supporting the adapter 14. A through-hole or keyway 24 is provided in the lip directly rearward of tab 22. While only a small portion of the lip is shown in the drawings, the lip would ordinarily include a series of spaced apart tabs and through-holes for the mounting of several teeth to the bucket. In the illustrated embodiment, the lip has a rounded digging edge 16 and an expanding region 26 by the through-holes 24. Nevertheless, many other lip configurations are possible for use with the invention.

Figure 22:
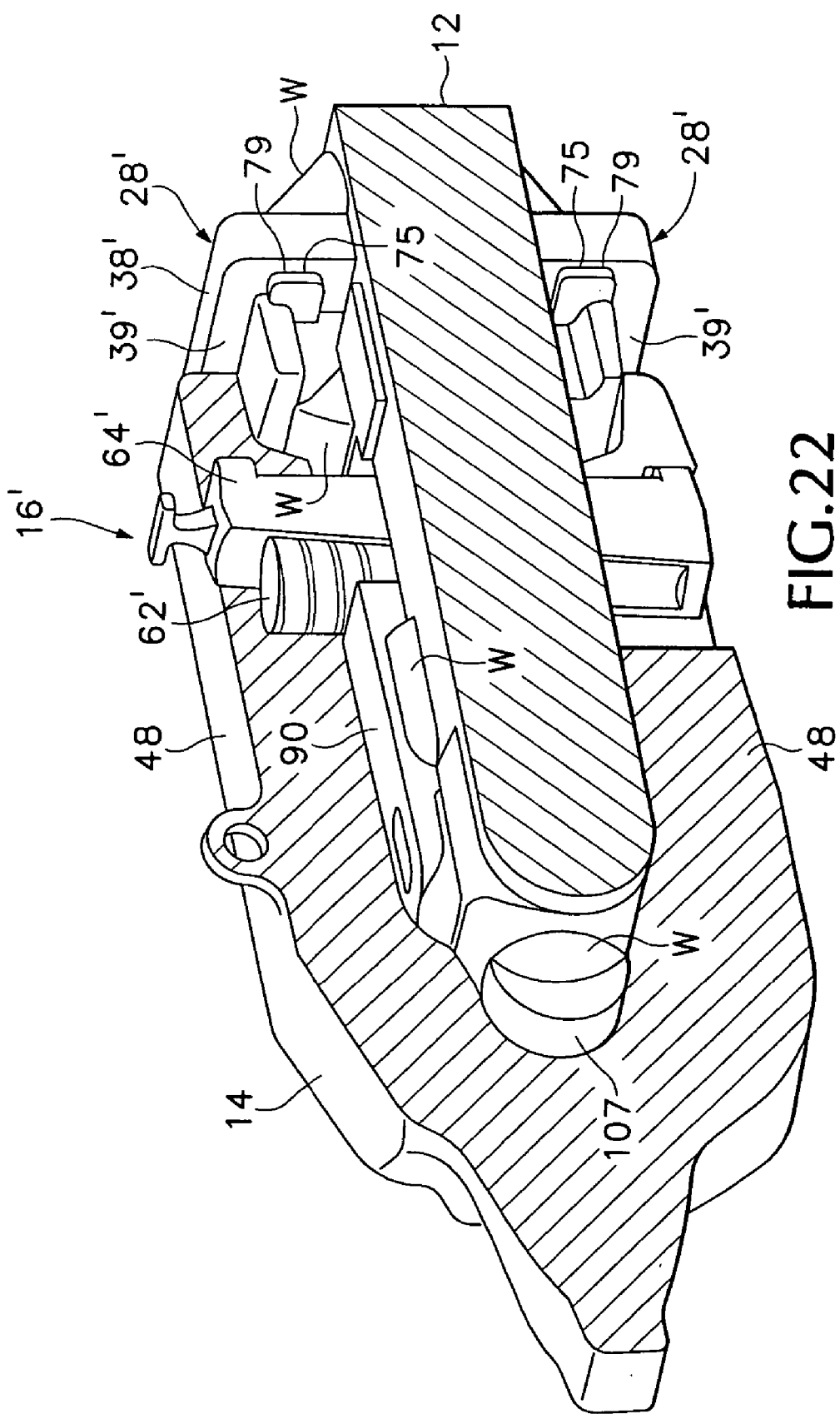
FIG. 22 is a perspective view of the alternative embodiment with the adapter shown in an axial cross-section.
Figure 23:
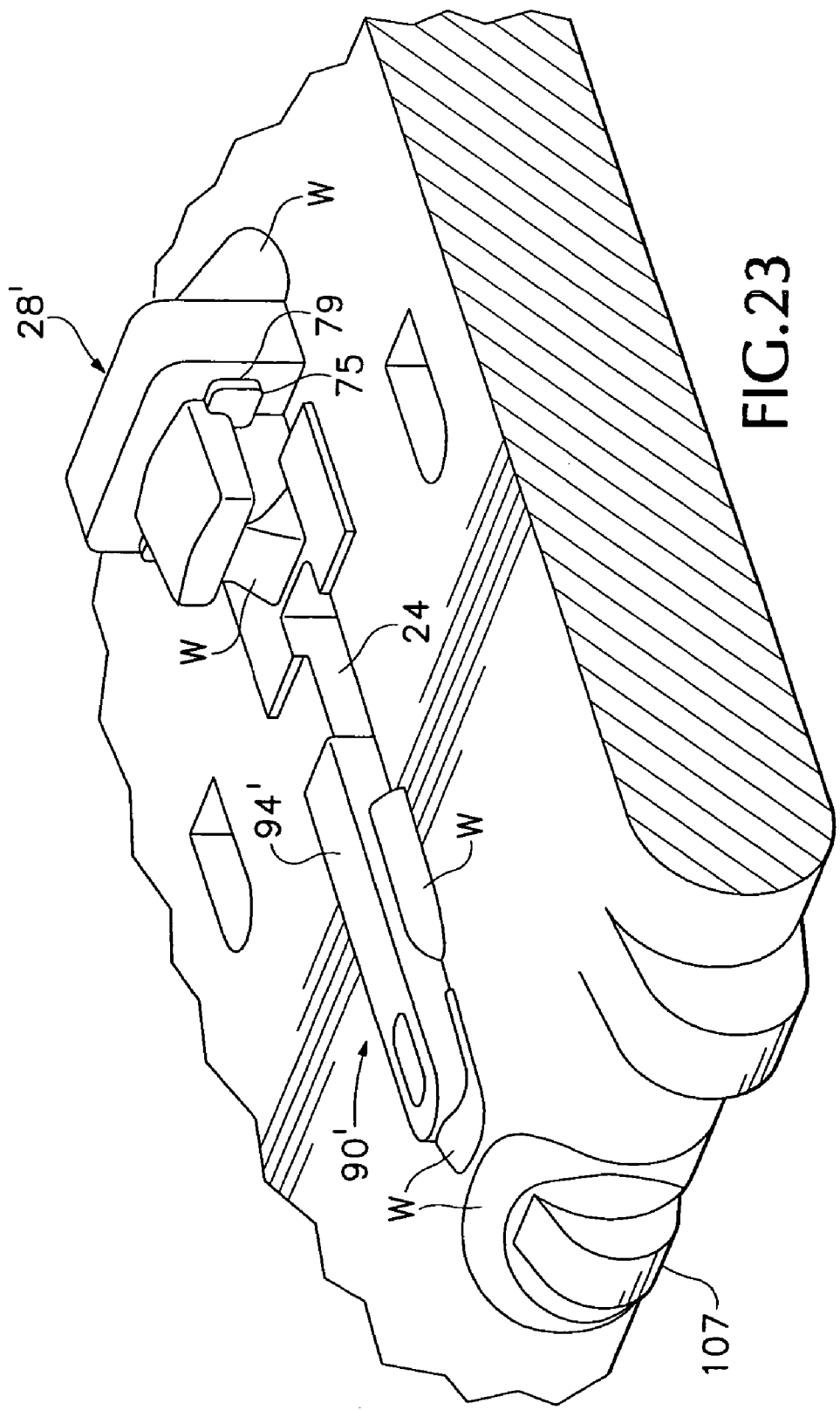
FIG. 23 is a perspective view of a portion of the lip in accordance with the alternative embodiment of the present invention.
Figure 24:
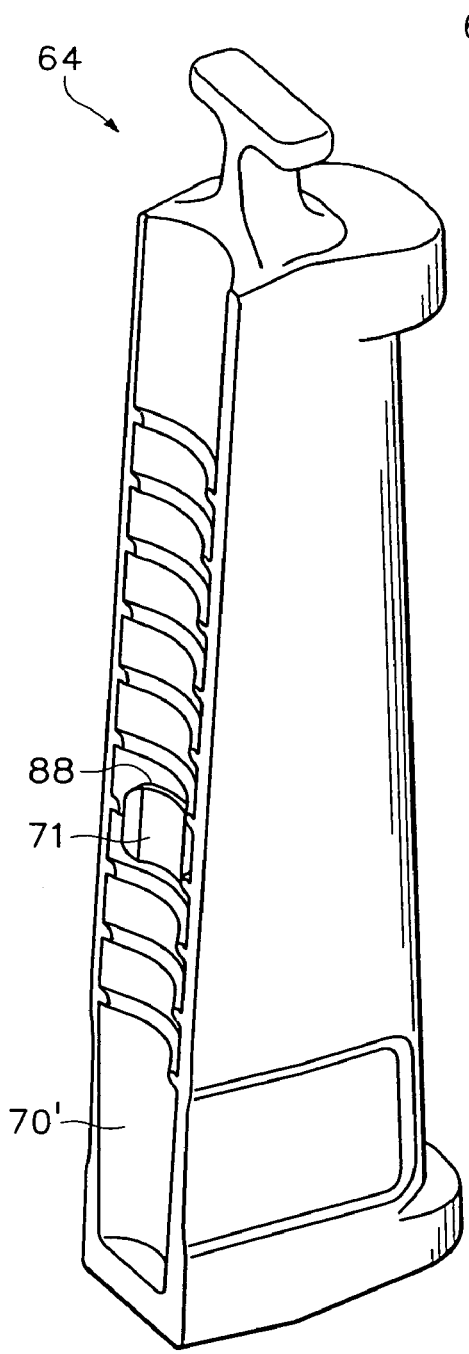
FIG. 24 is a perspective view of the spool of the alternative embodiment.
Figure 25:
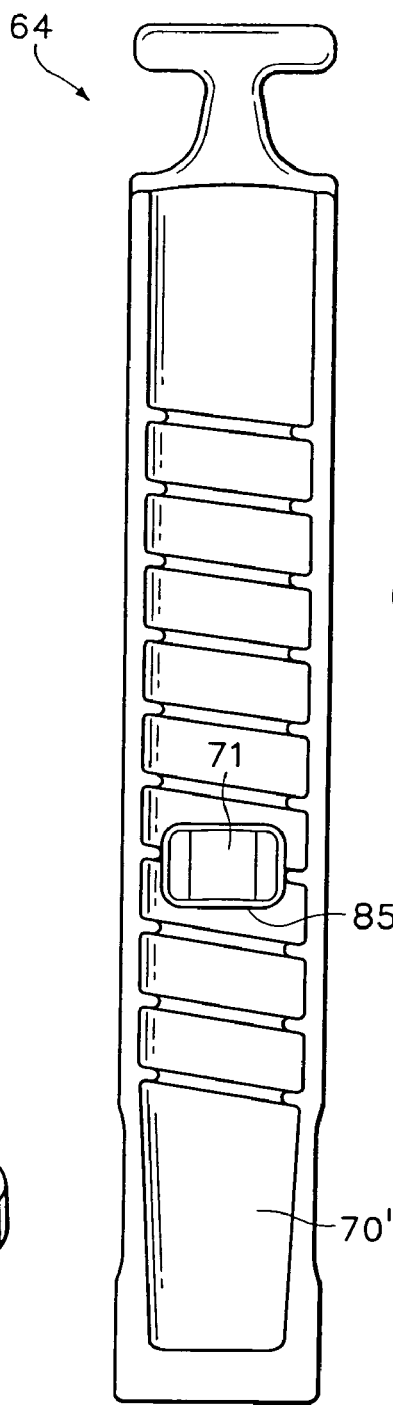
FIG. 25 is a front view of the spool of the alternative embodiment.
Figure 26:
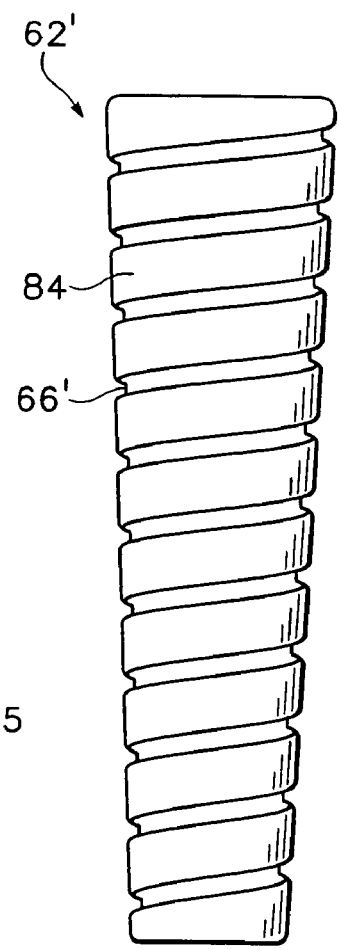
FIG. 26 is a side view of the wedge of the alternative embodiment.
Figure 29:
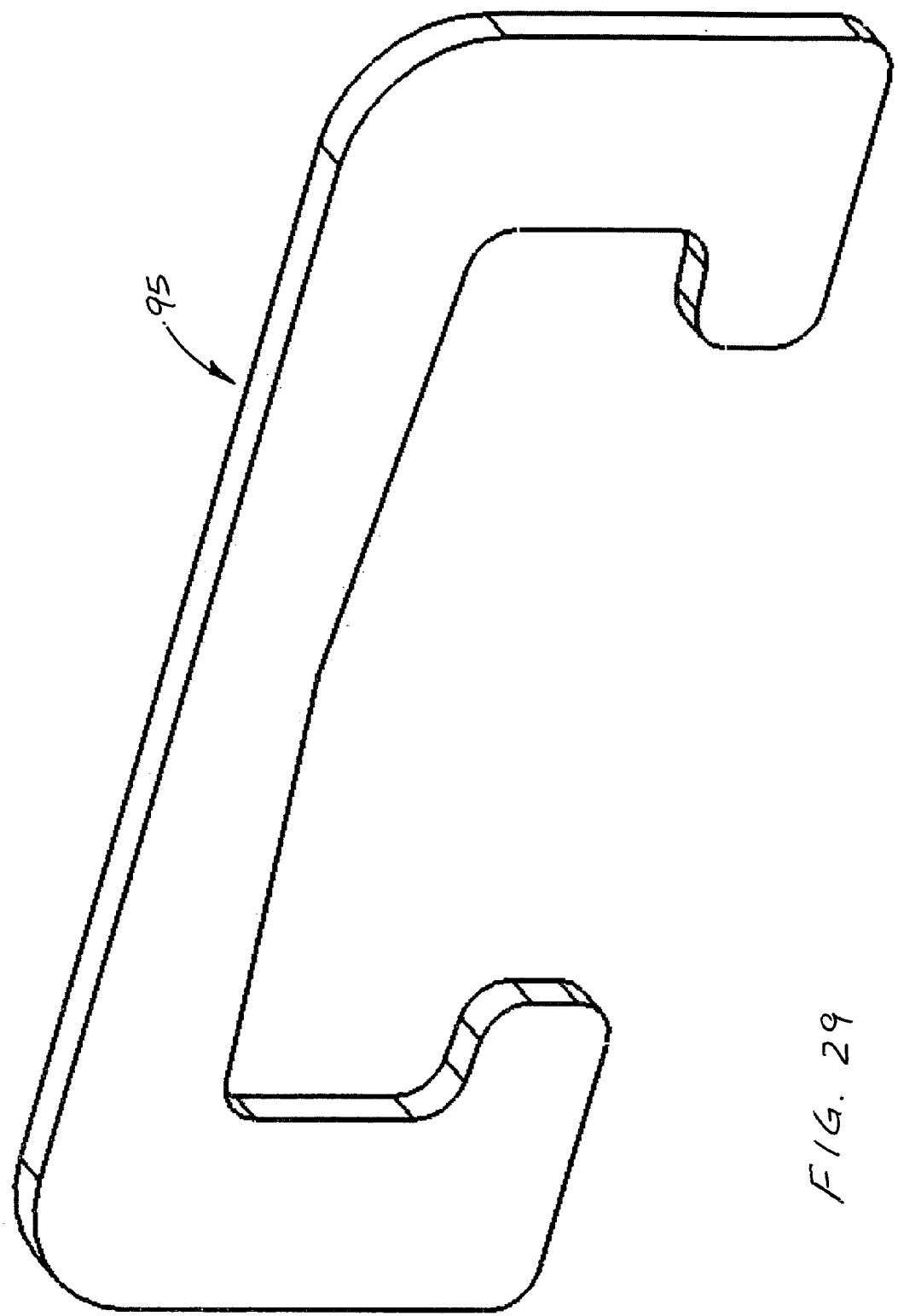
FIG. 29 is a perspective view of an alternative insert.

Bosses 28 are fixed to the lip rearward of and in alignment with each through-hole 24 (FIGS. 1-4 and 9). Preferably, an inner boss 28a is secured to extend along inner face 18 of lip 12 and an outer boss 28b is secured to extend along outer face 20 for each through-hole. Nevertheless, a single boss on the inner face 18 (or outer face 20) could be used. Although the bosses are preferably welded to the lip, they could be formed as an integral portion of the lip or attached by mechanical means. Also, while the bosses are shown to be fixed directly adjacent the through-holes 24 in FIG. 2, they are preferably spaced rearward of the through-holes as shown in FIGS. 22 and 23.

Figure 12:
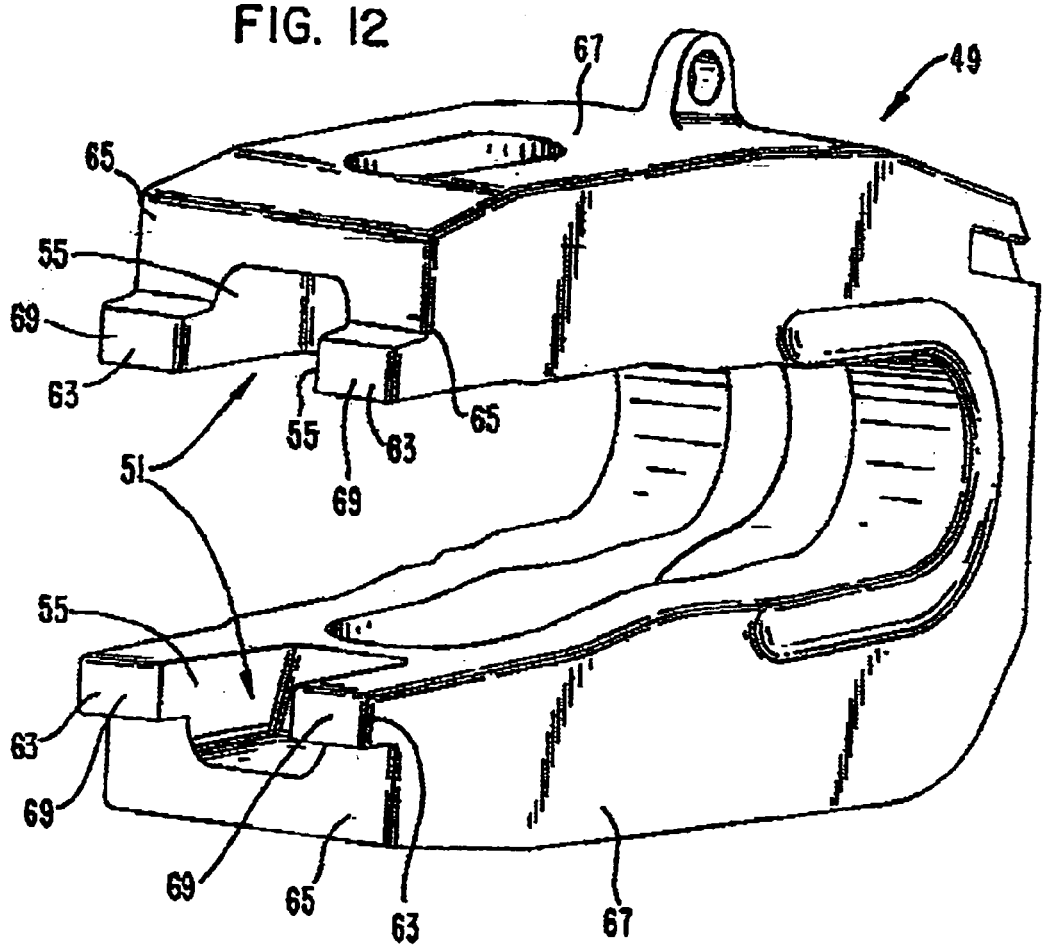
FIG. 12 is partial, rear perspective view of an alternative adapter.
Figure 13:
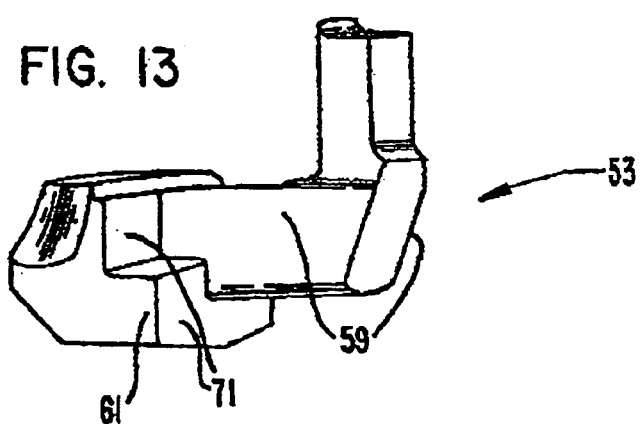
FIG. 13 is a perspective view of an alternative outer boss to cooperate with the adapter of FIG. 12.
Figure 14:
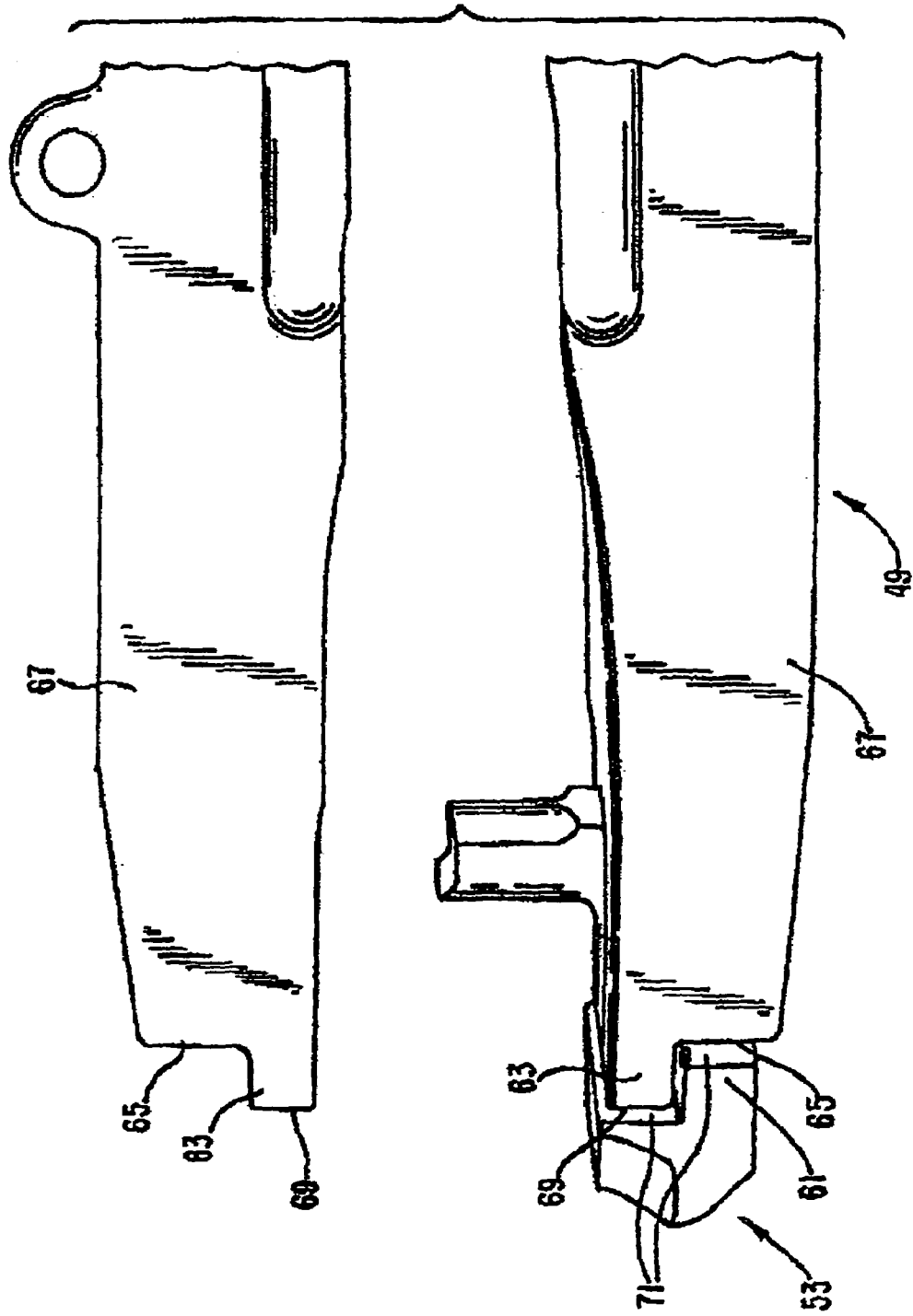
FIG. 14 is a partial perspective view of the combination of the boss and adapter illustrated in FIGS. 12 and 13 without the lip or inner boss.

Each boss 28 includes at least a main body 30 that extends in axial alignment with a through-hole 24 along either the inner face 18 or outer face 20 of the lip. The main body 30 preferably has a T-shaped configuration with a base 32 and laterally extending flanges or rails 34. The undersides of the rails 34 define holding surfaces 36 that generally face the lip to hold the adapter to the lip. Nevertheless, the main body could have other similar shapes (such as a dovetail configuration), other formations that provide other rails or holding surfaces facing the lip (see, e.g., the later discussed alternative embodiment in FIGS. 12-14), or even a parallelepiped or other shape with no rails or holding surfaces. Although a boss with no lateral rails or holding surfaces does not hold the adapter to the lip in the same way as a T-shaped boss or the like, it does still provide lateral support for resisting the applied loads. Additionally, the tongue and groove arrangement could be reversed such that the boss defines the slot that receives a tongue defined by the wear member. In this arrangement, the holding surfaces of the boss that resist outward movement of the wear member (i.e., away from the lip) still generally face toward the lip but are contained in the slot of the wear member.

The bosses are also preferably longitudinally tapered, widening toward the rear, to facilitate ease of installation and removal of the wear member. However, bosses with no such longitudinal taper are possible, particularly where there is inadequate space available to include the taper.

The bosses 28 also preferably each includes a rear member 38 at the rear end of the main body 30 to provide enhanced support for the laterally extending rails 34 or the like. In particular, rear member 38 is fixed to the lip and along the lateral projections of the rails, at their rear ends, to strengthen the rails in resisting the applied loads. When outwardly extending rails are used (e.g., as in FIG. 3), the rear member is fixed to and extends laterally outward of at least part of the main body to provide enhanced support for rails 34. When the boss defines the slot, the rails project inward, thus requiring no lateral outward extension of the rear member. While rear member 38 can be spaced from the rear wall 52 of adapter 14 during use, it can also be positioned to abut the adapter (FIGS. 1-4 and 9). In the illustrated embodiment, rear member 38 extends at least laterally beyond the base 32, and preferably, also laterally and outwardly beyond rails 34 when abutting adapter 14 to maximize the surface area to abut the rear end of the adapter. This abutment provides support to resist the applied loads and rearward shifting of the legs so as to reduce the loads applied to the digging edge 16 of lip 12.

In one preferred construction (FIGS. 22 and 23), the front surface 39' of rear member 38' of boss 28' is provided with an abutting surface formed by at least one insert 75. In a preferred embodiment, insert 75 is composed of a softer material (e.g., a softer steel alloy) than the body of the boss, but it could be of the same hardness or harder. In any event, inserts 75 are preferably replaceably secured within pockets 79 in the body of boss 28' to form the abutting surface. Alternatively, insert 95 could be shaped to fit over main body 30 and cover front surface 39'. Insert 95 could be secured to the adapter or the boss, or simply be fit between the two parts. Inserts having other constructions could also be used. The inserts function to maintain a tighter fit between the front of the lip and the wear member by lessening the rebound that occurs during use due to the contact between the rear walls 52 of the adapter legs 48 and the abutments and/or reducing the amount of the load that is carried by the abutments.

In either case, use of the abutments stops axial shifting of the legs and thereby reduces the risk that the lock will loosen during use. When used to abut adapter 14, rear walls 52 of the adapter may be machined to assure close positioning of front surface 39 to rear walls 52 when the adapter is first slid onto the lip and abuts digging edge 16. By relieving the pounding and stress applied to the digging edge of the lip, as compared to a conventional Whisler-style adapter, the lip will last longer and require less maintenance during its useful life. Ordinarily, in a conventional Whisler-style adapter, the front of the lip suffers considerable abuse and must periodically be built up with weld or other material. Although the rear member is preferably formed as part of the boss, it could be a separate part secured to or cast integrally with the lip.

In a preferred embodiment, each boss is fixed to the lip in alignment with and spaced rearward of through-hole 24. However, the bosses can additionally include a stem 40 that extends into the adjacent through-hole 24. The stem provides greater support for the boss against the applied loads, particularly when rear member 38 is formed as an abutment part of the boss. The stem also enables the inner and outer bosses 28a, 28b to be welded to each other to effect a clamping or gripping of the lip by the bosses and thereby enhance the strength of the attachment of the bosses to the lip. To ease this interconnection of bosses 28a, 28b, the ends of the two stems, together, preferably form a weld groove 42 to facilitate a welding procedure from above the lip of the bucket. The stems can also be welded to the lip within through-hole 24.

Adapter 14 is a wear member that is mounted to the lip of a bucket to hold the earth-penetrating tooth points in place (FIGS. 1-2, 6 and 9-11). Adapter 14 includes a forwardly projecting nose 44 for mounting a point 45 (FIGS. 1 and 2), and a mounting end 46 with bifurcated legs 48 to straddle the lip 12. In the preferred embodiment, the legs are of equal length and are each provided with a slot 50 shaped to receive the inner and outer bosses 28a, 28b. In the illustrated embodiment (FIG. 6), the slot is T-shaped to matingly receive bosses 28. However, the slot could vary so long as the slot shape still receives the boss to provide the desired support to resist lateral or outward pressures on the legs. Moreover, the shape of the slot can vary depending on the shape of the boss and the loads to be resisted. Further, limited advantages can be obtained through the use of a boss and slot on only one of the inner and outer faces 18, 20 of the lip, although better support is provided through the use of both bosses 28a, 28b.

Figure 6:
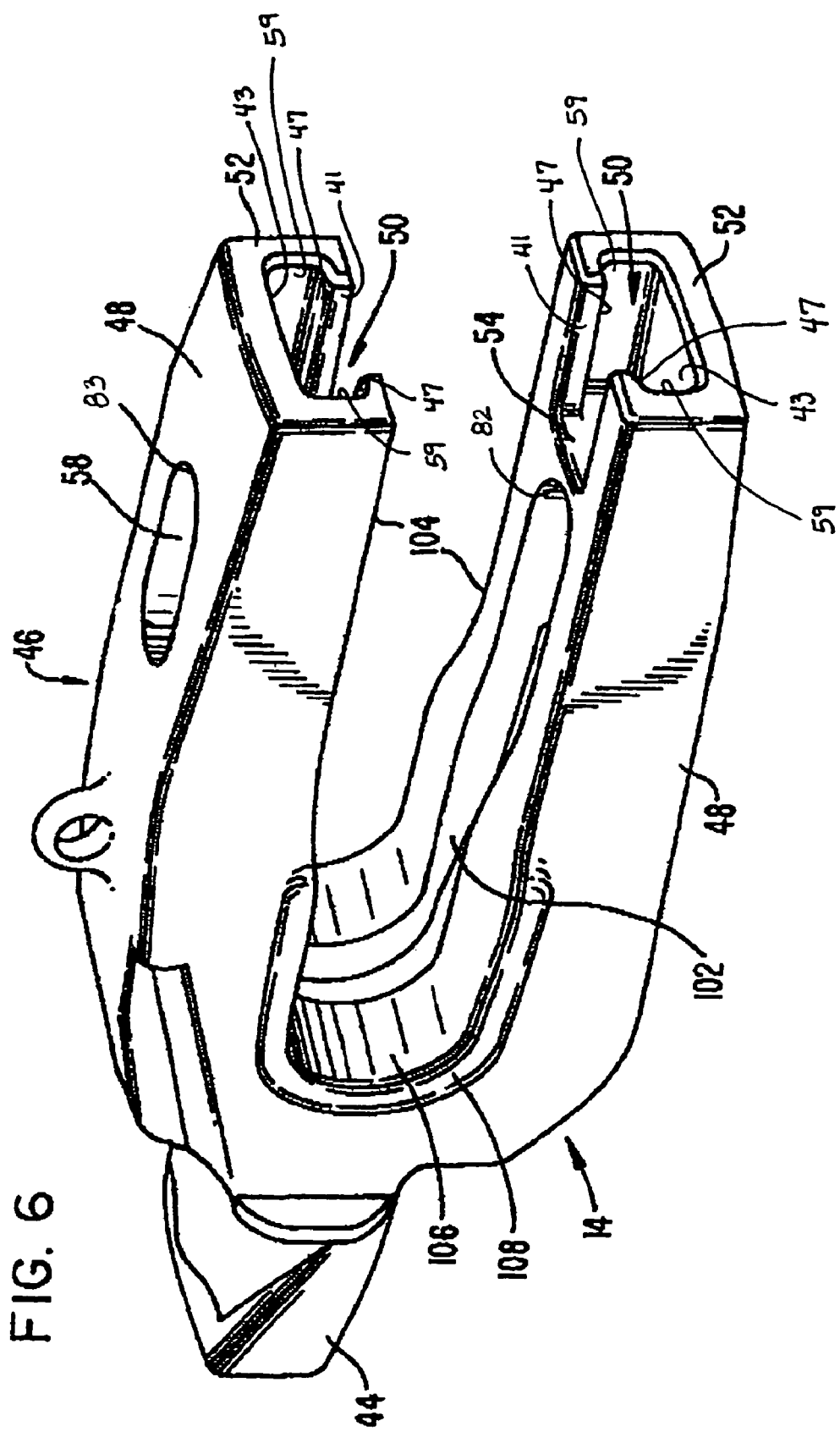
FIG. 6 is a rear perspective view of a wear member in accordance with the present invention in the form of an adapter.
Figure 9:
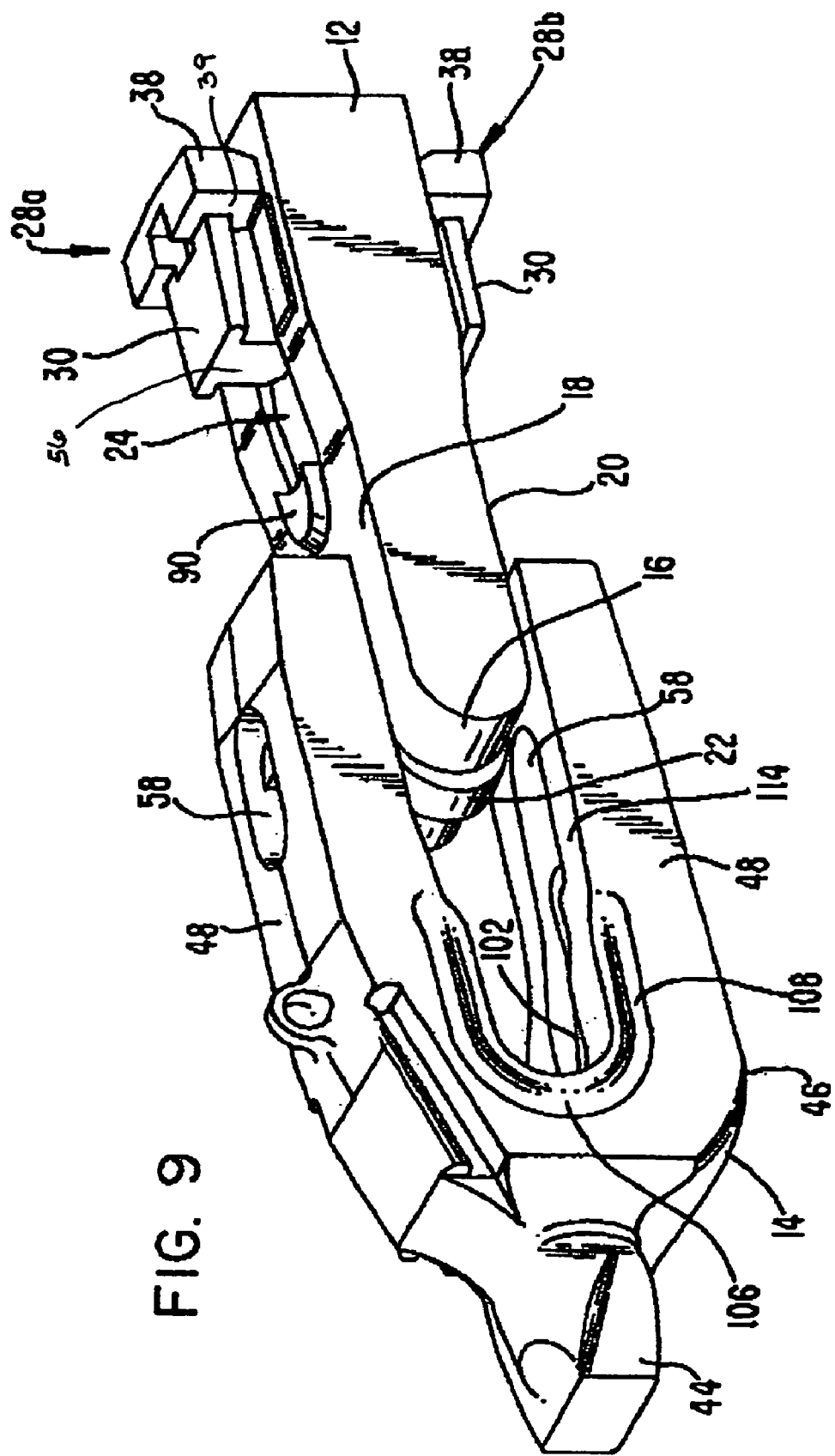
FIG. 9 is a perspective view showing a wear member partially fit onto a lip provided with the bosses of the present invention.

As seen in FIG. 6, the slots 50 are open in the rear walls 52 of legs 48 to slidingly receive the bosses therein. Each said slot 50 preferably includes a recessed wall 43 spaced from and facing the respective face 18, 20 of lip 12. A narrowed portion 41 sets between the recessed wall 43 and the lip to define retaining surfaces 47 to oppose holding surfaces 36 and retain rails 34 in grooves 59 of slot 50. Each slot 50 preferably extends forward only a short distance from rear wall 52; i.e., a distance approximately equal to the length of the main body 30 of the boss. In this way, the lateral wall 54 at the front of slot 50 can abut the front wall 56 of boss 28 as rear wall 52 of leg 48 abuts rear member 38 to resist axially applied loads. By using both the front wall 56 and rear member 38, the surface area resisting the loads can be maximized to lower the stress in the wear member 10 and lip 12. Lateral wall 54 can extend entirely across slot 50 as shown (FIGS. 6 and 12) or only partially across (not shown). It should, however, be understood that it not necessary for the front wall 56 of main body (or front member) 30 or the front wall 39 of rear member 38 to abut the adapter 14.

In another embodiment (FIGS. 12-14), an alternative adapter 49 includes slots 51 without a T-shape or similar construction. Specifically, slots 51 and bosses 53 have complementary, generally flat sidewalls 55, 59 that extend generally perpendicular to the faces 18, 20 of the lip. In place of flanges or rails 34 along the sides of the bosses, bosses 53 include a forwardly projecting flange or overhang 61 spaced from the respective lip 18, 20. Fingers 63 project rearward from rear ends 65 of adapter legs 67 to fit between flange 61 and lip 12 to prevent outward movement of the adapter legs 67 relative to lip 12, and thereby support the legs against heavy upward or downward directed loads applied to the point. In addition, the rear ends 65 of legs 67 and rear ends 69 of fingers 63 preferably abut front faces 71 of boss 53 to reduce the loads applied to digging edge 16 of lip 12, but could be formed with a gap to avoid such abutment. Nevertheless, as noted above, fingers 63 and flanges 61 could be omitted so that there are no transverse holding surfaces to resist the legs moving away from the lip.

As can be appreciated, the primary loads on the teeth are applied at the earth-penetrating front ends of the points. As the teeth are forced through the ground, the points are subjected to loads of varying intensity, kind, and direction. As a result, many of the applied loads press on the points at angles to the longitudinal axis of the tooth. Hence, large forces are applied to the adapter holding the point to the bucket. By fitting the rear ends of legs 48 over the fixed bosses 28 (FIGS. 1 and 2), the bosses are able to effectively resist the reaction forces in all directions with bosses shaped with rails or other holding surfaces and at least in lateral directions with bosses without rails or holding surfaces. In the preferred embodiment, the bosses function in cooperation with lip pads 57 to support the legs, but, alternatively, they can provide the entire support for the back ends of the adapter legs.

A hole or opening 58 extends through each leg 48 forward of slot 50 to receive a lock 70 (FIGS. 1-2, 7-8 and 10-11). Lock 60 is described in detail in U.S. Pat. No. 7,171,771, which is hereby incorporated in its entirety by reference. Additionally, the cradles as described in U.S. Pat. No. 7,174,661, hereby incorporated in its entirety by reference, could also be used in conjunction with the assemblies described herein.

In one embodiment, lock 60 includes a wedge 62 and spool 64 that are threadedly coupled together to tightly hold the adapter to the lip. Wedge 62 has generally a frusto-conical shape with a helical groove 66 forming a thread formation. The spool 64 has a generally C-shaped configuration with two arms 68 and a channel or trough 70 adapted to receive a portion of the wedge. The channel includes spaced apart helical ridge segments 72 to form a thread formation to complement helical groove 66. As the wedge is rotated, the engaged thread formations cause the wedge to move axially along the spool, and hence, into and out of the aligned openings 58 and through-hole 24. A recess 74 with flats is provided in one end of wedge 62 for engaging a wrench. A rubber cap 76 can be fit into the recess 74 during use to prevent earthen fines from becoming embedded therein.

Also, as discussed in U.S. Pat. Nos. 7,171,771 and 7,174,661, a thread formation to complement the thread formation in the wedge could be formed in the insert 90, 90' or in the front of the through-hole 24 in lieu of or in addition to the thread formation on the spool. Also, the threads could be reversed with grooves in the spool or other components and a helical ridge formed on the wedge.

In one embodiment, a retainer in the form of a resiliently biased pawl 78 (FIG. 8) is provided in the spool to engage a series of ratchet teeth (not shown) formed in the helical groove. The pawl is preferably formed in channel 70 along one of the ridge segments, although it could be formed in other wall surfaces adjacent wedge 62. In any event, pawl 78 engages the teeth as the wedge is rotated such that the wedge can be turned to drive the wedge into the through-hole 24 but prevented from turning in a direction that drives the wedge out of the through-hole. The pawl can be broken by application of a wrench on wedge 62 to remove the wedge from the assembly.

Nevertheless, the pawl and teeth are preferably replaced, as seen in lock 16' (FIGS. 20-21 and 24-28), with a resilient retainer 77 (formed of rubber or another elastomer) placed in a pocket 85 formed in the channel or trough 70' of spool 64'. The retainer is fit within pocket 85 in trough 70' with a front surface 87 projecting from the trough to press against the land 84 on wedge 62'. This frictional engagement resists unwanted loosening of the wedge during operation.

Retainer 77 is preferably a block shaped elastomeric member having a front surface 87 to engage the wedge and a rear surface 93 facing the spool. The front surface preferably includes a pair of side portions 87a, 87b separated by a medial concave portion 87c. The concave portion is adapted to apply the desired pressure against the wedge. Nevertheless, other constructions could be used. Retainer 77 is press fit and frictionally held within pocket 85. Flanges 89 are preferably provided to help hold the retainer in place. The retainer could also be secured by an adhesive, molding or other means. As seen in FIG. 28, holes 91 are preferably formed in the rear surface 93 of the retainer to facilitate the desired compression of the retainer. The holes are faced into the spool to shield them from being filled with earthen material. Retainer 77 is preferably located in a middle portion of trough 70', though it could be positioned at other locations along the trough. Further, retainer 77 could alternatively be fit within a pocket formed in the front wall of through-hole 24 or insert 90 and press against wedge 62' in essentially the same way. Wedge 62' is formed with the same construction as wedge 62 except that no teeth are formed within groove 66'.

Figure 2:
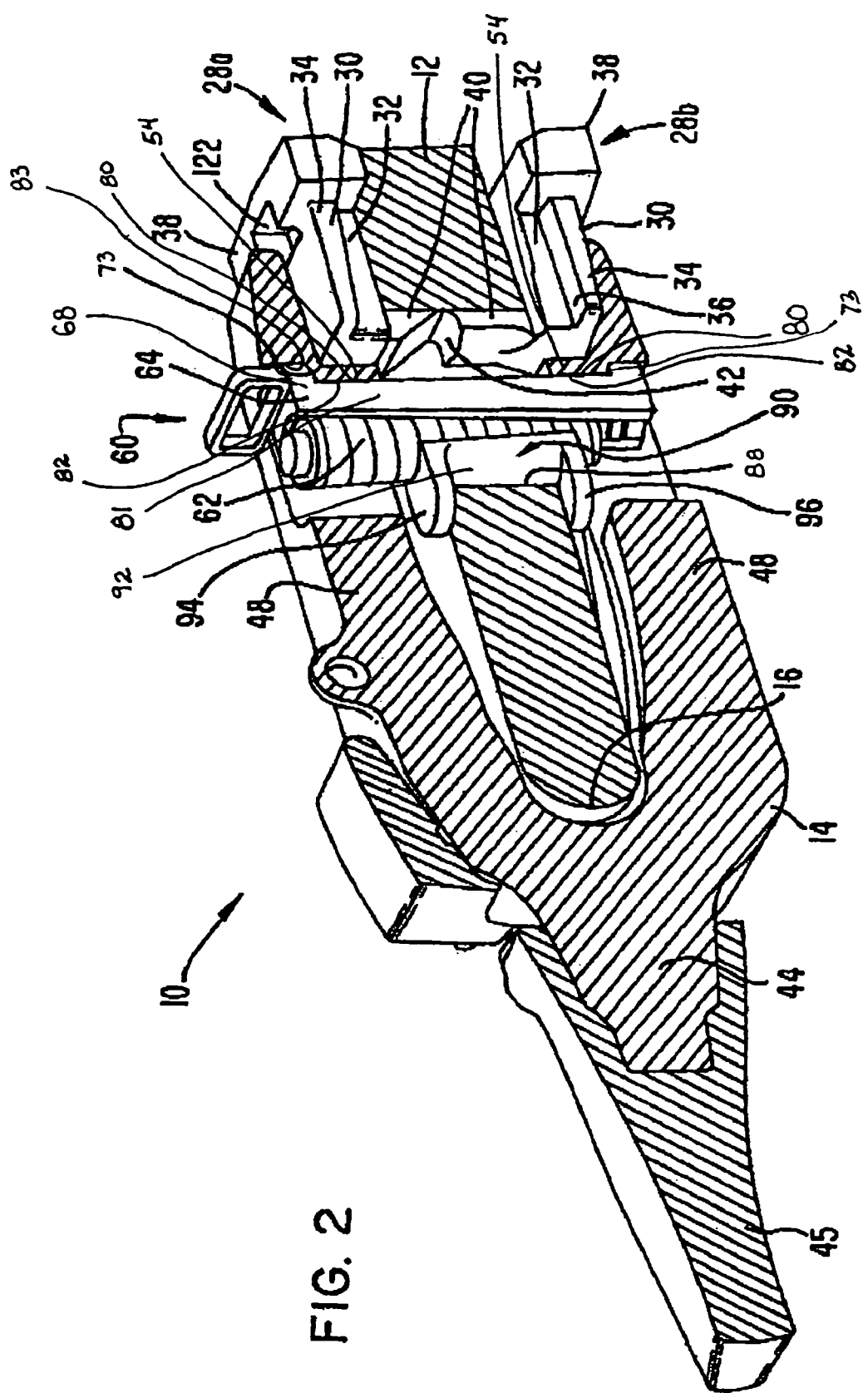
FIG. 2 is a cross-sectional view taken along line 11-11 in FIG. 1.
Figure 3:
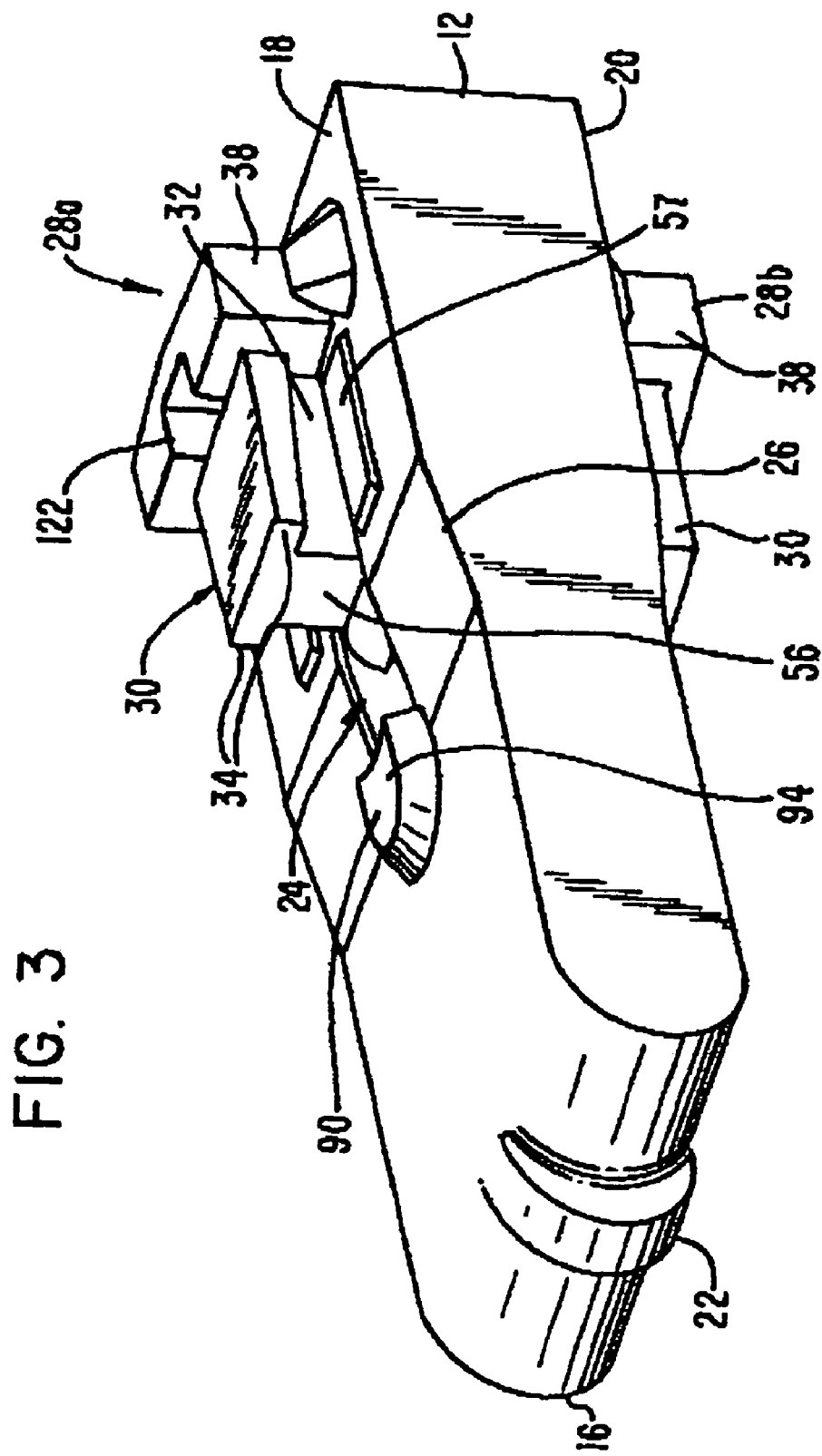
FIG. 3 is a perspective view of a portion of a lip of an excavator with bosses attached in accordance with the present invention.
Figure 10:
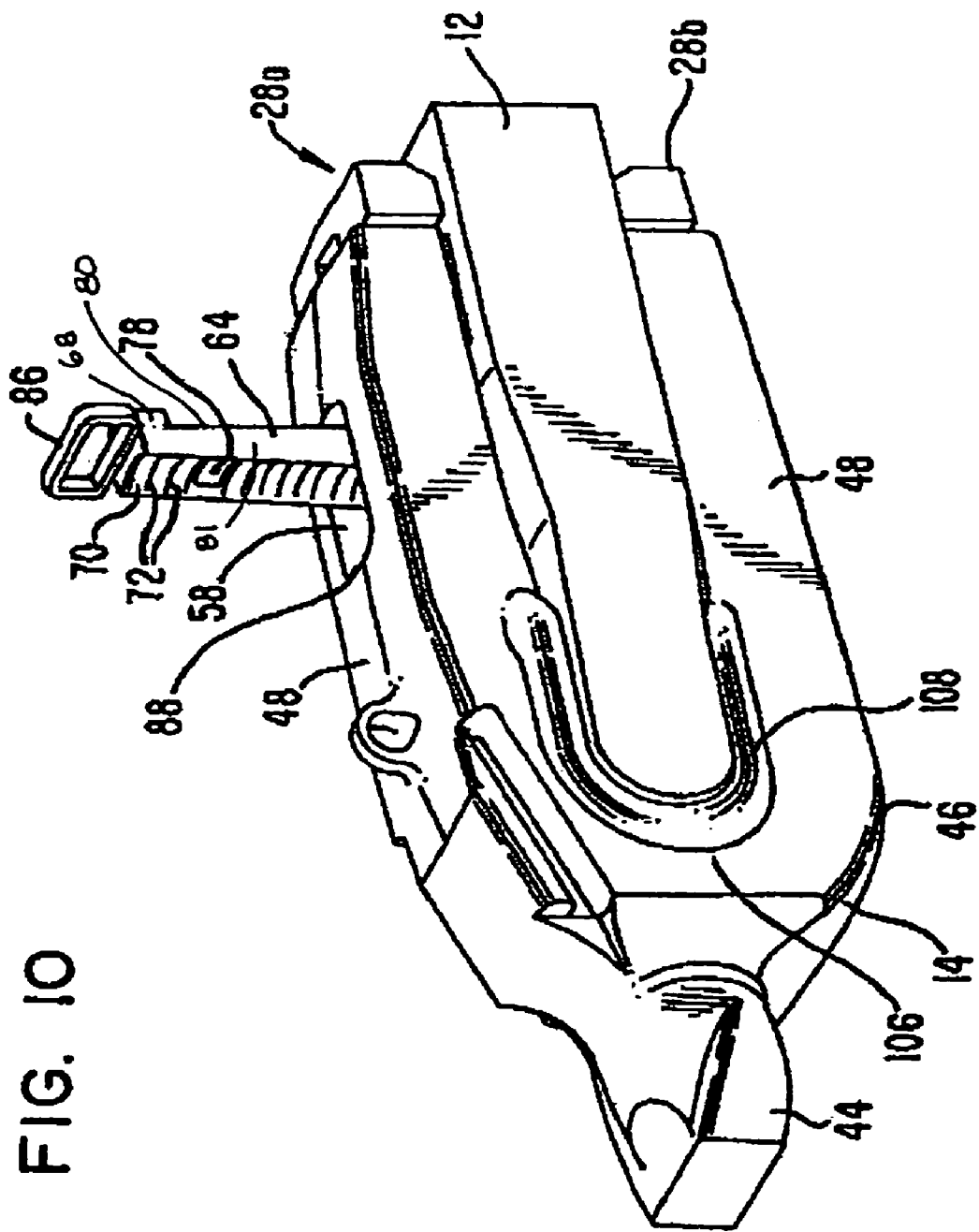
FIG. 10 is a perspective view of a spool being fit into a wear assembly in accordance with the present invention.
Figure 11:
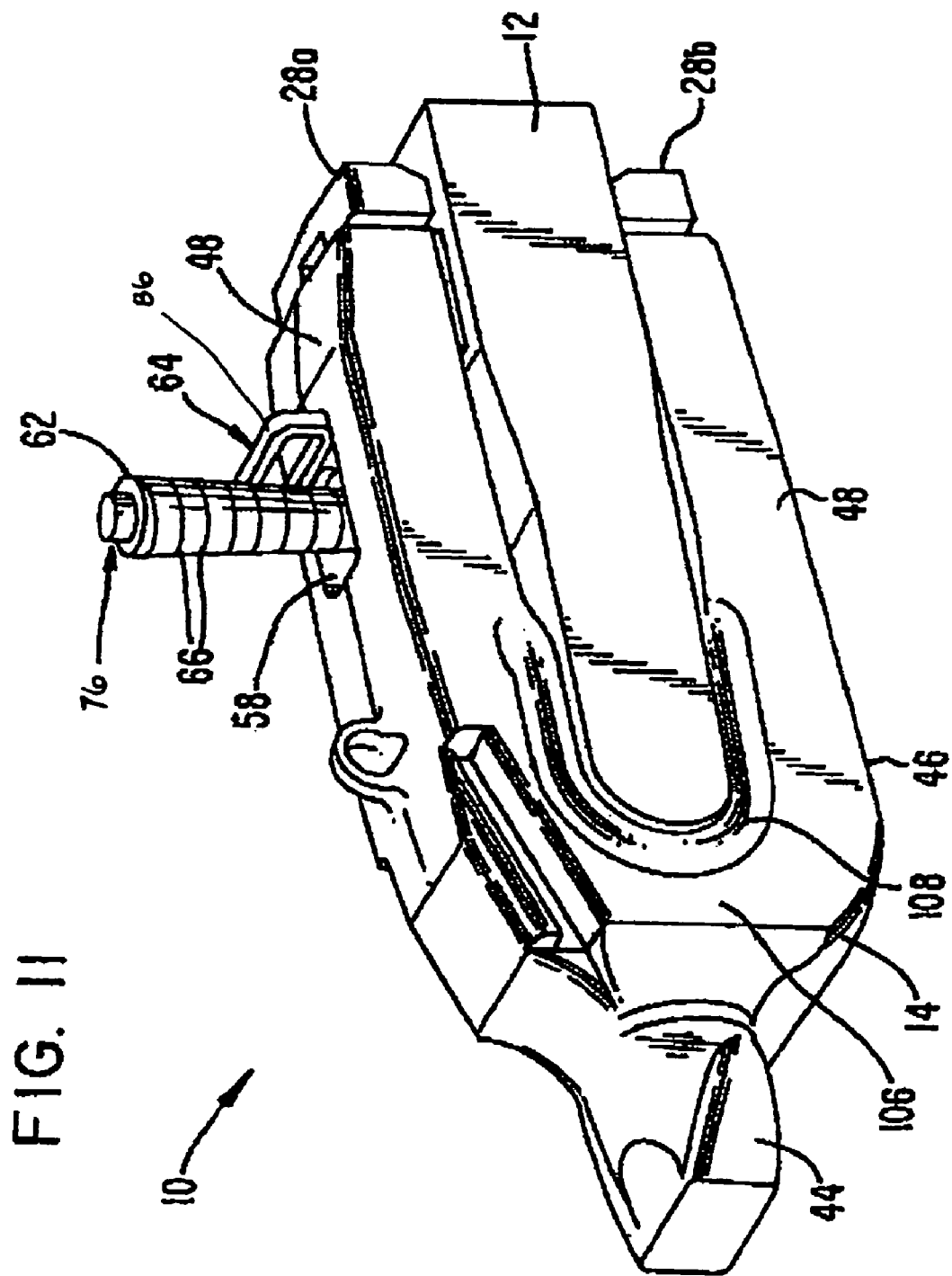
FIG. 11 is a perspective view of a wedge being fit into a wear assembly in accordance with the present invention.

In use, spool 64 is inserted into openings 58 and through-hole 24 such that surfaces 80 along shank portion 81 abut the front face 82 of lateral wall 54 (FIGS. 2 and 10). As seen in FIG. 2, openings 58 each preferably includes a pocket 83 for receiving arms 68. In this way, the spool is anchored to prevent the spool from moving as the wedge is rotated. Nevertheless, other arrangements besides the use of arms 68, such as flanges on the adapter, could be used to secure the spool in the assembly. With such other securing means, arms 68 could be omitted. A handgrip 86 is provided for the operator to position and temporarily hold the spool in place while the wedge is inserted. Once the spool is in its proper position, the wedge is inserted into channel 70 and turned to drive the wedge tightly into place (FIG. 11). While the wedge can abut directly against the front end 88 of through-hole 24 (FIG. 2), a keyway insert 90 is preferably welded into place at the front of through-hole 24.

Keyway insert 90 preferably has a generally C-shaped configuration with a central body 92, an inner flange 94 and an outer 96 flange (although other shapes are possible). Inner and outer flanges 94, 96 overlie and are welded to the inner and outer faces 18, 20, respectively, of lip 12. The rear surface 98 of central body 92 is preferably arcuate to receive the front side of wedge 62. Keyway insert 90 functions to provide a longer and more deformation resistant bearing surface for wedge 62. Also, it provides a maintenance advantage in that it can be replaced, whereas, weld rebuilding of the keyway is not only difficult, but can actually result in a failure of the lip due to the heat affects of welding in a high stress zone. In the preferred construction (FIGS. 22 and 23), insert 90' includes elongated flanges 94', 96' along the inner and outer faces 18, 20 of lip 12. The inner surfaces of legs 48 are formed with channels in which flanges 94', 96' are received. Alternatively, one or more elongated flange segments may be fixed to the lip in alignment with short flanges 94, 96 of insert 90 (FIGS. 2 and 3) as separate components to achieve the same effect as insert 90'. In either case, these flanges provide additional side support for the adapter. FIGS. 22 and 23 also illustrate exemplary welds W that may be used to secure the boss and insert to the lip.

The threaded wedge and spool could be replaced with a conventional fluted wedge 101 (FIG. 18) and fluted spool 103 (FIG. 19) where the wedge is hammered into place. Alternatively an unthreaded wedge (not shown) having the same conical shape or a generally block shape (i.e., with generally flat walls) could be used. In the case of the unthreaded wedge, the channel in the spool would be formed without the ridge segments and the pawl (not shown). In the case with flat wedge walls, the spool (not shown) would be modified to provide a generally flat front surface instead of channel 70. The unthreaded wedges would in either case be hammered into place as is common with a lock for a conventional Whisler-style adapter.

Adapter 14 further preferably includes a central groove 102 along inner surfaces 104 of legs 48 and bight portion 106. The central groove is adapted to fit about tab 22 for additional support of the adapter. The central groove also accommodates keyway insert 90 during axial sliding of the adapter onto and off of the lip. The bight portion 106 is preferably built up with an outer lip 108 to provide greater support and a larger surface area in contact with the digging edge 16 of lip 12. In a preferred construction (FIGS. 22 and 23), the lip is formed with a hardened steel insert 107 secured by a weld W into a recess 109 (formed as a cutout or by casting); i.e., insert 107 is preferably formed of a harder steel than lip 12. The insert, then, forms the tab 22' and the portion of the lip against which the adapter abuts.

Figure 15:
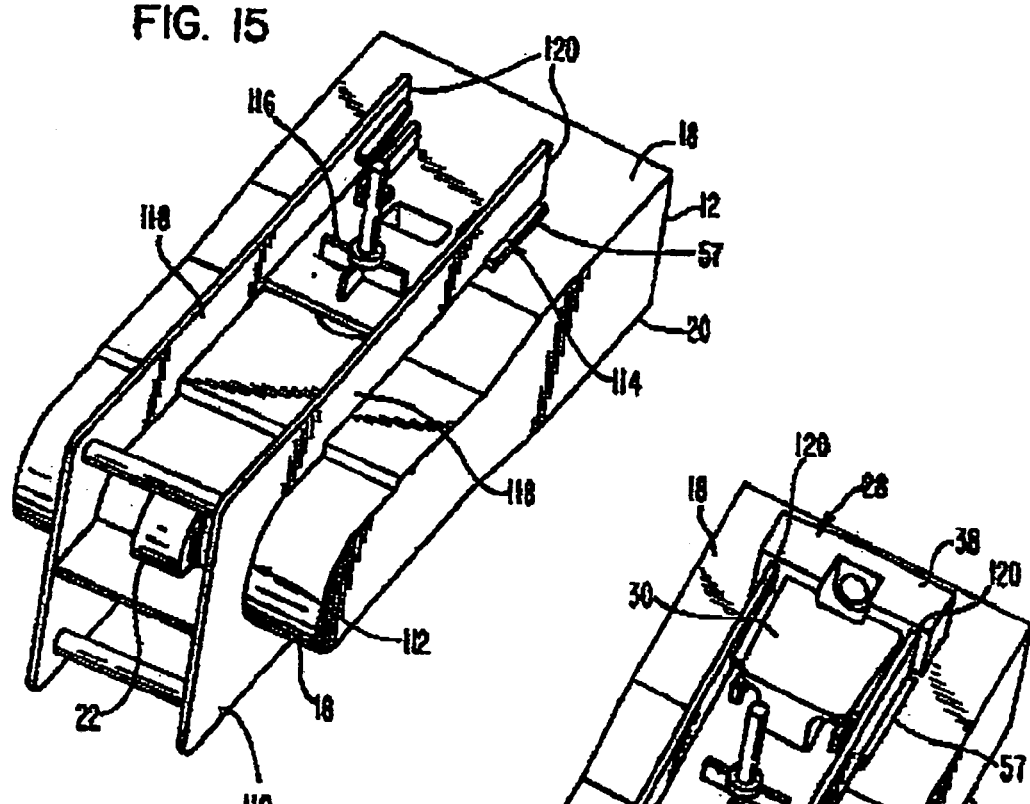
FIG. 15 is a perspective view of the use of a gauge fixture to retrofit a lip to use preferred aspects of the present invention.
Figure 16:
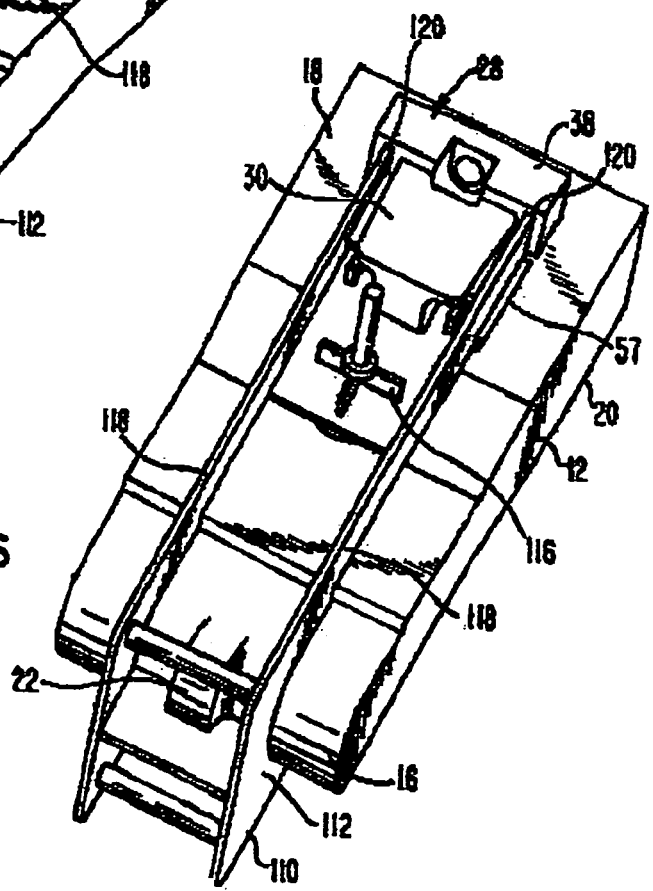
FIG. 16 is a perspective view of the gauge fixture being used to position and attach the bosses of the present invention to a lip.
Figure 17:
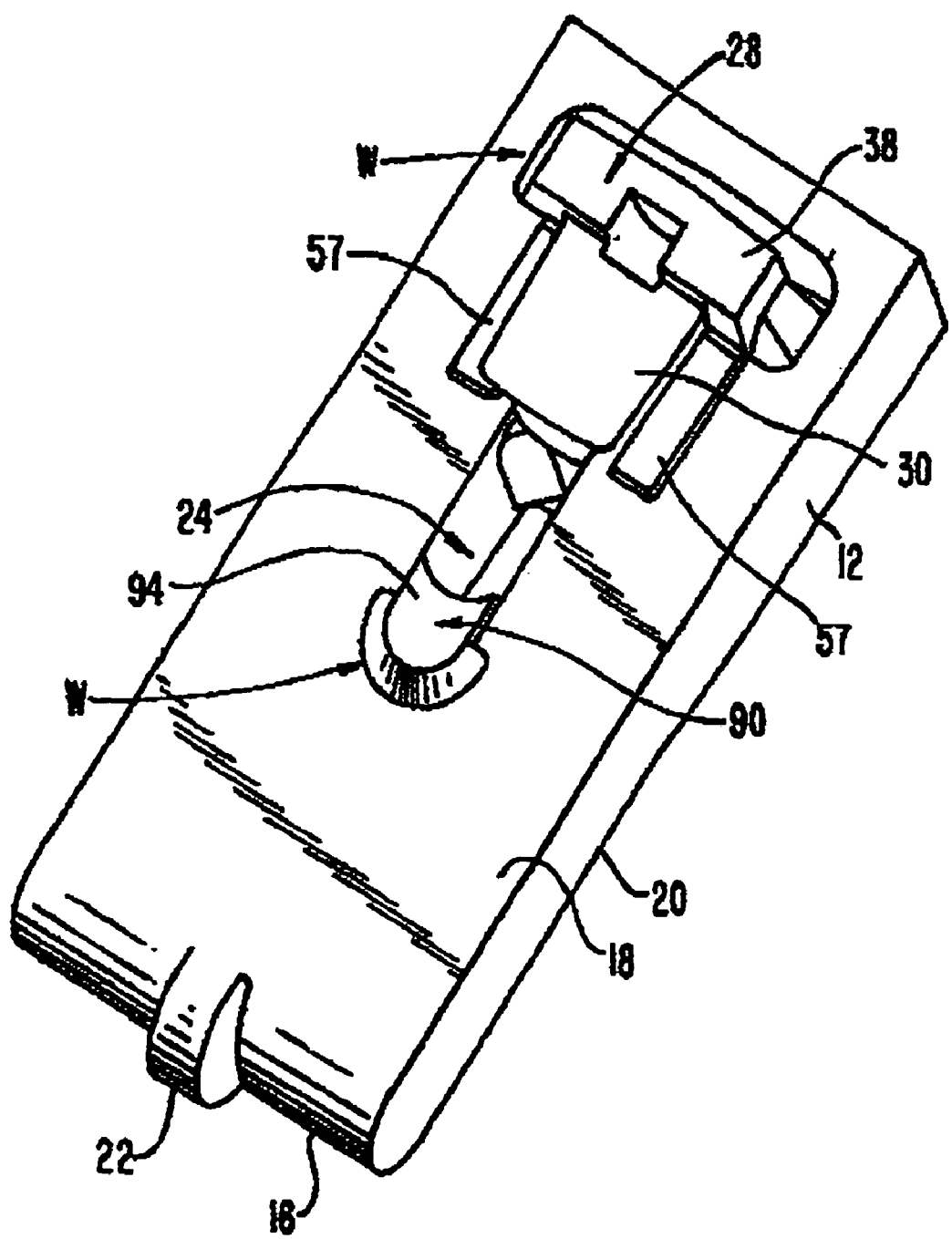
FIG. 17 is a perspective view of the preferred weld pattern in fixing the bosses and keyway insert to a lip.
Figure 20:
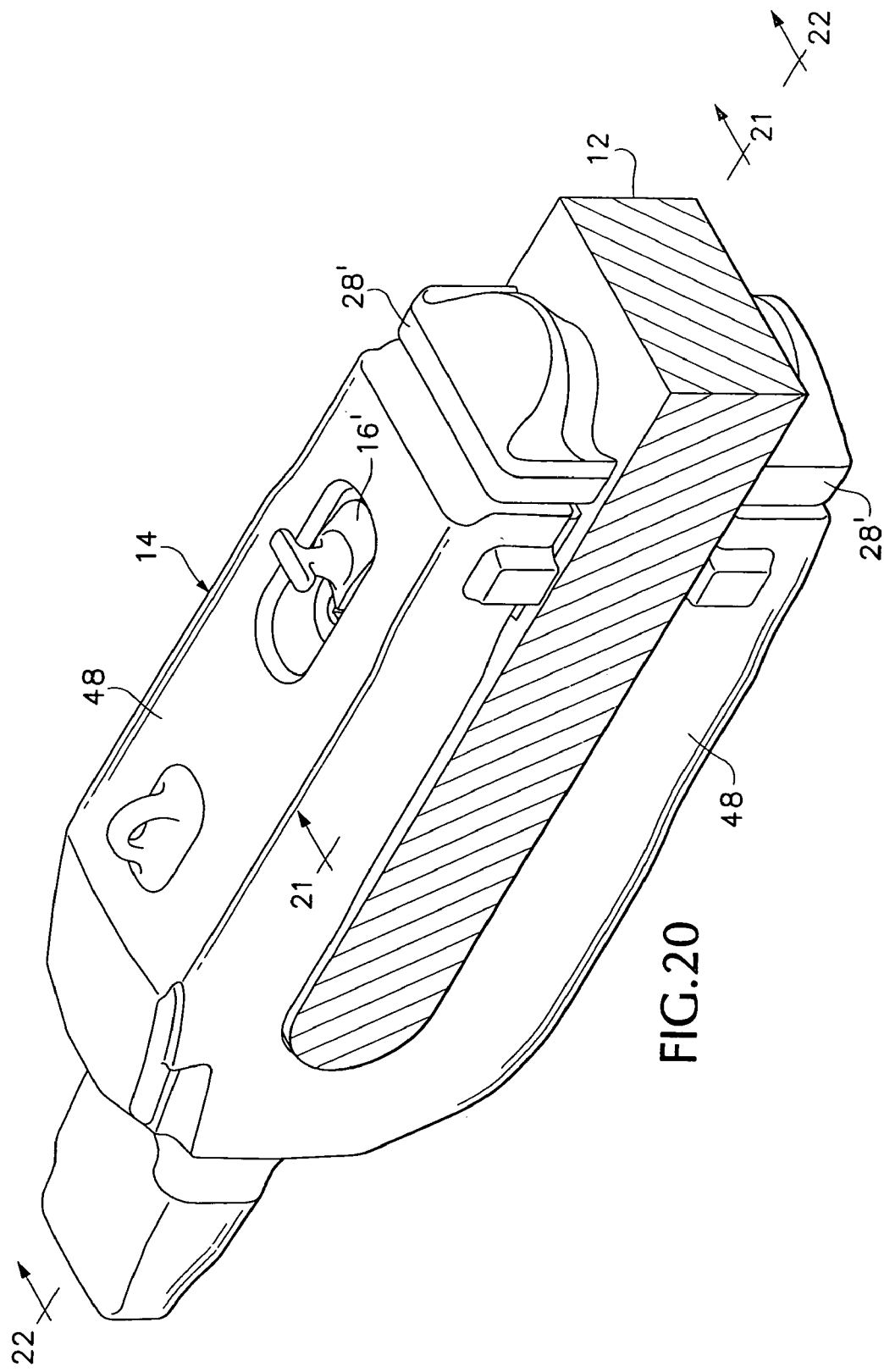
FIG. 20 is a perspective view of an adapter mounted on a portion of a lip of an excavator (with the welds excluded) in accordance with an alternative embodiment of the present invention.
Figure 21:
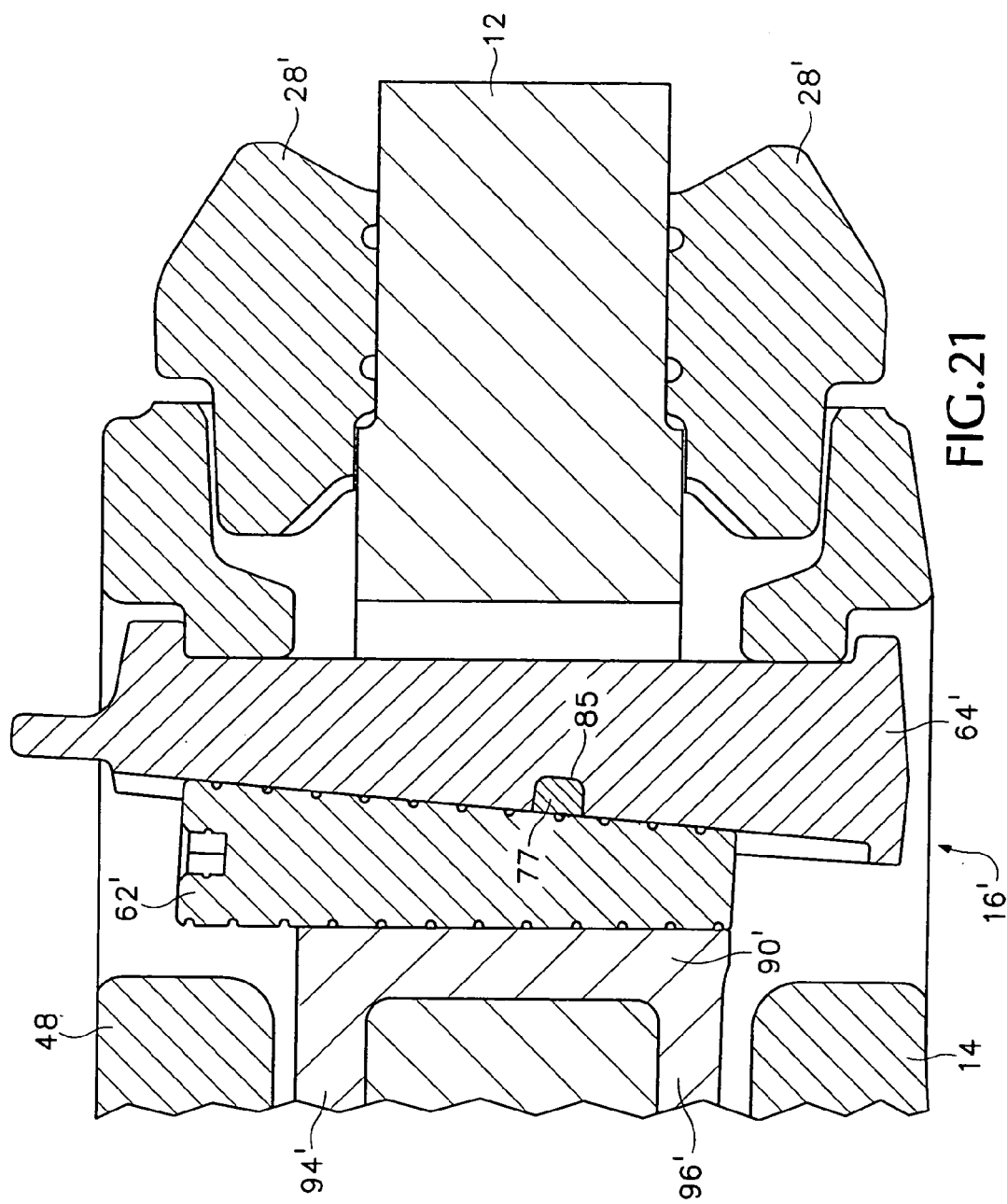
FIG. 21 is a cross-sectional view taken along line 21-21 in FIG. 20.

The present invention is amenable to being used with existing lips initially constructed to be used with conventional Whisler-style adapters. In these situations, it may be necessary to adapt the lip to better accommodate the attachment of adapters 14. A gauge fixture 110 as shown in FIGS. 15 and 16 can be slid over the lip and bayonet 116 inserted to determine where the lip should be built up. In particular, it may be desirable to build up the digging edge 16 and pads 57 with weld material until they contact front portions 112 and rear portions 114 of gauge fixture 110. It may also be desirable to grind a radius around the inner and outer edges of through-hole 24. Bosses 28 are positioned by legs 118 of gauge fixture 110 with stems 40 in through-hole 24 and rear member 38 against the rear ends 120 of gauge fixture 110. The bosses are preferably welded to lip 12 along the sides and rear surface of the rear member 38, to each other via notch 42, and to the lip along the stems 40 in through-hole 24. The main bodies 30 of bosses 28 may also, if desired, be welded along lip 12. The keyway insert 90 is also placed into through-hole 24 at its front end, and welded to lip 12 along the front ends of flanges 94, 96, keeping the weld away from the high stress region of the through hole.

In assembly, the adapter is rearwardly slid onto the bucket with one leg 48 to each side of the lip 12 so that bosses 28 are received into slots 50. The rearward movement of adapter 14 continues until bight portion 106 abuts digging edge 16. In the preferred construction, the front wall 54 of slot 50 abuts against boss 28 and/or rear wall 52 against rear member 38 only after wear begins to develop due to use of the bucket. Nevertheless, if desired, these other surfaces could be formed as the first abutting face instead of bight portion 106. Once the adapter is properly positioned, lock 60 is inserted into openings 58 and through-hole 24. Specifically, spool 64 is placed with arms 68 resting on ledges 73 of opening 58. Wedge 62 is, then, threaded into the assembly by engaging groove 66 with ridge segments 72 and turning the wedge about its axis. The threading continues until the wedge tightens to a set level of torque. Pawl 78 engages the ratchet teeth in groove 66 and holds the wedge in a locked, tightened condition. Cap 76 is preferably placed in recess 74 to prevent fines from becoming impacted in the recess.

To remove the adapter, the cap is first removed to permit a wrench to be fit in recess 74. The wedge is turned to drive the wedge upward so that it can be lifted out of the assembly. The spool 64 is removed from the assembly. Adapter 14 can then be pulled from the lip. If the adapter is stuck in place, a pry tool (not shown) can be inserted into hole 122 and pulled to pry adapter 14 from lip 12.

The above discussion concerns the preferred embodiments of the present invention. Various other embodiments as well as many changes may be made without departing from the spirit and broader aspects of the invention as defined in the claims.

The invention claimed is:

1. A wear member for attachment to a lip of an excavating bucket comprising a front working portion projecting forward of the lip and a pair of rearward extending legs adapted to straddle the lip, each said leg having an inner surface to face the lip, an opposite outer surface, a rear wall extending generally transverse to the inner surface, a slot opening in the inner surface and the rear wall to receive a boss fixed to the lip, and a hole extending through the leg and opening in the inner and outer surfaces to receive a lock to hold the wear member to the lip, each said hole including a recess adjacent the outer surface for receiving and anchoring a portion of the lock, and each said recess being partially defined by a face positioned between the inner and outer surfaces of the respective leg and facing generally away from the lip, wherein said faces of said recesses are generally parallel to each other.

2. A wear member in accordance with claim 1 wherein the hole is defined at least in part by a front wall portion and a rear wall portion, and the recess is formed in the rear wall portion.

3. A wear member in accordance with claim 2 wherein the slot is defined only between the hole and the rear wall.

4. A wear member In accordance with claim 2 wherein the wear member is an adapter and the front working portion includes a nose for mounting a point.

5. A wear member in accordance with claim 1 wherein the slot is defined only between the hole and the rear wall.

6. A wear assembly for attaching a wear member to a lip of an excavating bucket, the wear assembly comprising:
- a wear member having a front working portion and a leg, the leg extending rearward over a surface of the lip and including a rear wall and a slot;
- a boss having a main member received in the slot and an abutment member to abut the rear wall of the leg;
- an insert to form an abutting surface between the rear wall of the leg and the abutment member of the boss; and
- a lock to releasably secure the wear member to the boss.

7. A wear assembly In accordance with claim 6 wherein the insert is releasably secured to one of the rear wall of the leg or the abutment member.

8. A wear assembly in accordance with claim 6 wherein the insert is formed of a softer material than the abutment member.

9. A wear assembly for attaching a wear member to a lip of an excavating bucket having at least one through-hole, the wear assembly comprising:
- a boss fixed to the lip rearward of the through-hole;
- an insert positioned along a front end of the through-hole, the insert including one arm extending forward from the through-hole along each of an inner surface and an outer surface of the lip, and a body positioned in the through-hole interconnecting the arms,
- a wear member having a front working portion and a pair of legs to straddle the lip, each said leg extending rearward over a surface of the lip and including a slot to receive the boss and a space to receive one said arm of the insert, the space being defined in part by side surfaces that contact said one arm for support against side loading; and
- a lock to releasably secure the wear member to the boss.

10. A wear assembly for attaching a wear member to a lip of an excavating bucket having at least one through-hole, the wear assembly comprising:
- a boss fixed to the lip rearward of the through-hole;
- an insert positioned along a front end of the through-hole, the insert including at least one arm extending forward from the through-hole along a surface of the lip, wherein the arm extends substantially the distance between the through-hole and a front edge of the lip,
- a wear member having a front working portion and a leg, the leg extending rearward over a surface of the lip and including a slot to receive the boss and a space to receive the arm of the insert, the space being defined in part by side surfaces that contact the arm for support against side loading; and
- a lock to releasably secure the wear member to the boss.

* * * * *